US012588493B2

(12) United States Patent
Kabir et al.

(10) Patent No.: US 12,588,493 B2
(45) Date of Patent: Mar. 24, 2026

(54) METAL SPACERS WITH HARD MASKS FORMED USING A SUBTRACTIVE PROCESS

(71) Applicant: Intel Corporation, Santa Clara, CA (US)

(72) Inventors: Nafees A. Kabir, Hillsboro, OR (US); Kevin L. Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 919 days.

(21) Appl. No.: 17/579,249

(22) Filed: Jan. 19, 2022

(65) Prior Publication Data

US 2023/0230919 A1 Jul. 20, 2023

(51) Int. Cl.
| | |
|---|---|
| *H01L 23/528* | (2006.01) |
| *H01L 21/768* | (2006.01) |
| *H01L 23/522* | (2006.01) |

(52) U.S. Cl.
CPC ...... *H01L 23/528* (2013.01); *H01L 21/76825* (2013.01); *H01L 23/5226* (2013.01); *H01L 23/5228* (2013.01)

(58) Field of Classification Search
CPC ............. H01L 23/528; H01L 21/76825; H01L 23/5226; H01L 23/5228; H01L 21/76843; H01L 21/76895; H01L 21/76885; H01L 21/76897
See application file for complete search history.

(56) References Cited

U.S. PATENT DOCUMENTS

| | | | |
|---|---|---|---|
| 2017/0025412 A1* | 1/2017 | Jun ...................... H10D 30/693 |
| 2020/0091162 A1* | 3/2020 | Morris ................ G11C 11/2259 |

* cited by examiner

*Primary Examiner* — Patricia D Valenzuela
(74) *Attorney, Agent, or Firm* — Arcane Law PLLC

(57) ABSTRACT

An integrated circuit device includes a first interconnect layer, and a conductive first interconnect feature and a conductive second interconnect feature laterally separated by a body of insulating or semiconductor material. In an example, the first and second interconnect features are above the first interconnect layer. The integrated circuit device further includes a non-conductive feature above and on the first interconnect feature, and a conductive third interconnect feature above and on the second interconnect feature. The integrated circuit device also includes a second interconnect layer above the non-conductive feature and third interconnect features. In an example, the second and third interconnect features conductively couple the first and second interconnect layers.

23 Claims, 16 Drawing Sheets

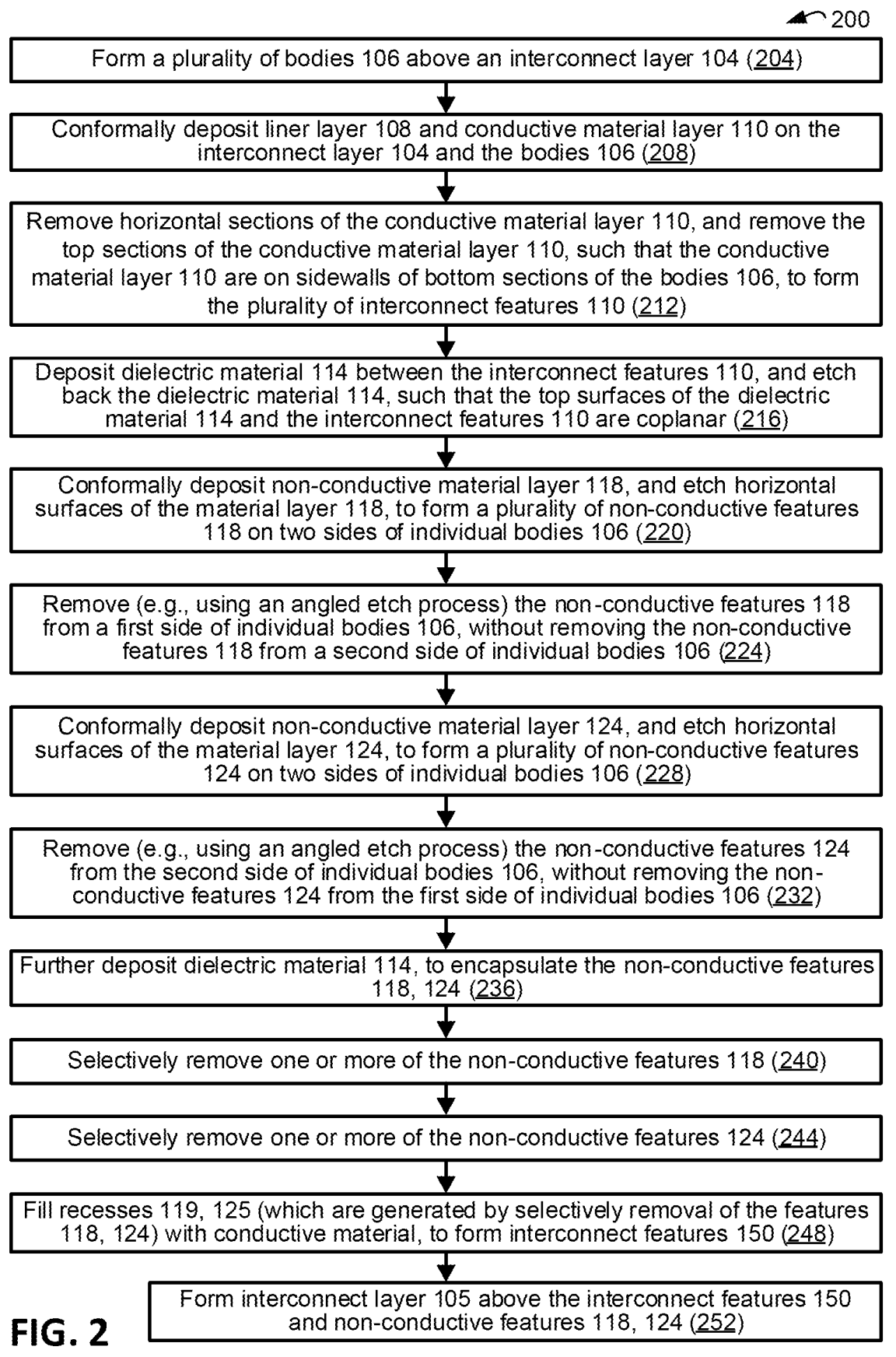

200

Form a plurality of bodies 106 above an interconnect layer 104 (204)

Conformally deposit liner layer 108 and conductive material layer 110 on the interconnect layer 104 and the bodies 106 (208)

Remove horizontal sections of the conductive material layer 110, and remove the top sections of the conductive material layer 110, such that the conductive material layer 110 are on sidewalls of bottom sections of the bodies 106, to form the plurality of interconnect features 110 (212)

Deposit dielectric material 114 between the interconnect features 110, and etch back the dielectric material 114, such that the top surfaces of the dielectric material 114 and the interconnect features 110 are coplanar (216)

Conformally deposit non-conductive material layer 118, and etch horizontal surfaces of the material layer 118, to form a plurality of non-conductive features 118 on two sides of individual bodies 106 (220)

Remove (e.g., using an angled etch process) the non-conductive features 118 from a first side of individual bodies 106, without removing the non-conductive features 118 from a second side of individual bodies 106 (224)

Conformally deposit non-conductive material layer 124, and etch horizontal surfaces of the material layer 124, to form a plurality of non-conductive features 124 on two sides of individual bodies 106 (228)

Remove (e.g., using an angled etch process) the non-conductive features 124 from the second side of individual bodies 106, without removing the non-conductive features 124 from the first side of individual bodies 106 (232)

Further deposit dielectric material 114, to encapsulate the non-conductive features 118, 124 (236)

Selectively remove one or more of the non-conductive features 118 (240)

Selectively remove one or more of the non-conductive features 124 (244)

Fill recesses 119, 125 (which are generated by selectively removal of the features 118, 124) with conductive material, to form interconnect features 150 (248)

Form interconnect layer 105 above the interconnect features 150 and non-conductive features 118, 124 (252)

FIG. 2

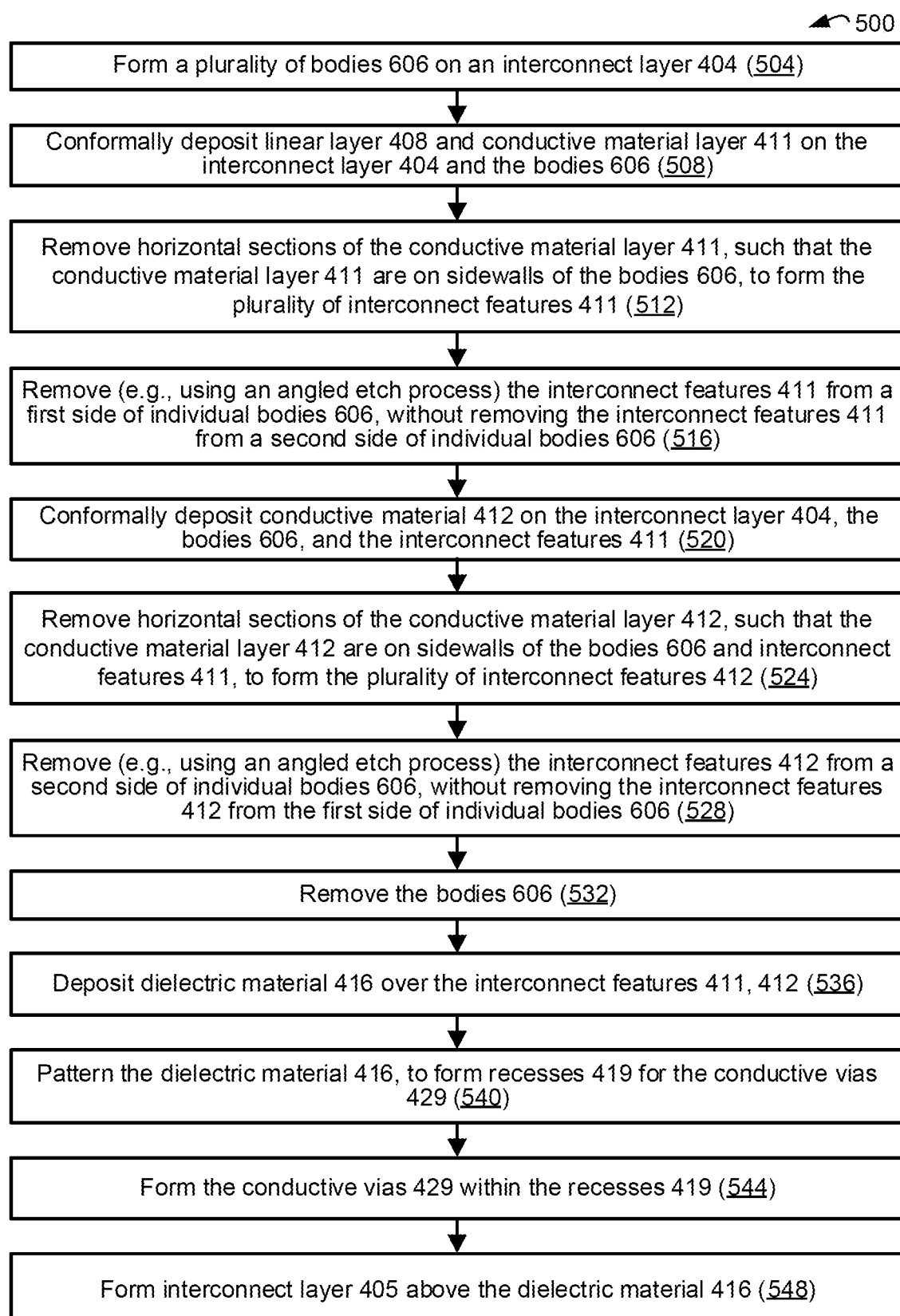

500

Form a plurality of bodies 606 on an interconnect layer 404 (504)

Conformally deposit linear layer 408 and conductive material layer 411 on the interconnect layer 404 and the bodies 606 (508)

Remove horizontal sections of the conductive material layer 411, such that the conductive material layer 411 are on sidewalls of the bodies 606, to form the plurality of interconnect features 411 (512)

Remove (e.g., using an angled etch process) the interconnect features 411 from a first side of individual bodies 606, without removing the interconnect features 411 from a second side of individual bodies 606 (516)

Conformally deposit conductive material 412 on the interconnect layer 404, the bodies 606, and the interconnect features 411 (520)

Remove horizontal sections of the conductive material layer 412, such that the conductive material layer 412 are on sidewalls of the bodies 606 and interconnect features 411, to form the plurality of interconnect features 412 (524)

Remove (e.g., using an angled etch process) the interconnect features 412 from a second side of individual bodies 606, without removing the interconnect features 412 from the first side of individual bodies 606 (528)

Remove the bodies 606 (532)

Deposit dielectric material 416 over the interconnect features 411, 412 (536)

Pattern the dielectric material 416, to form recesses 419 for the conductive vias 429 (540)

Form the conductive vias 429 within the recesses 419 (544)

Form interconnect layer 405 above the dielectric material 416 (548)

FIG. 5

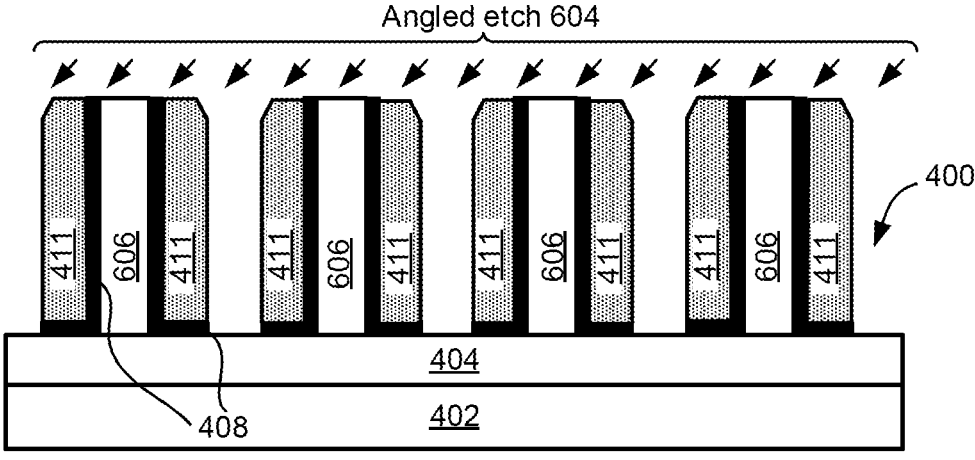
FIG. 6E
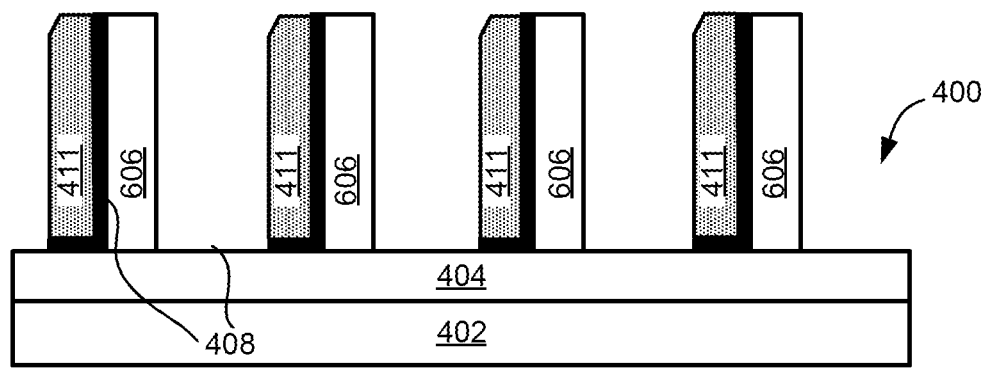
FIG. 6F
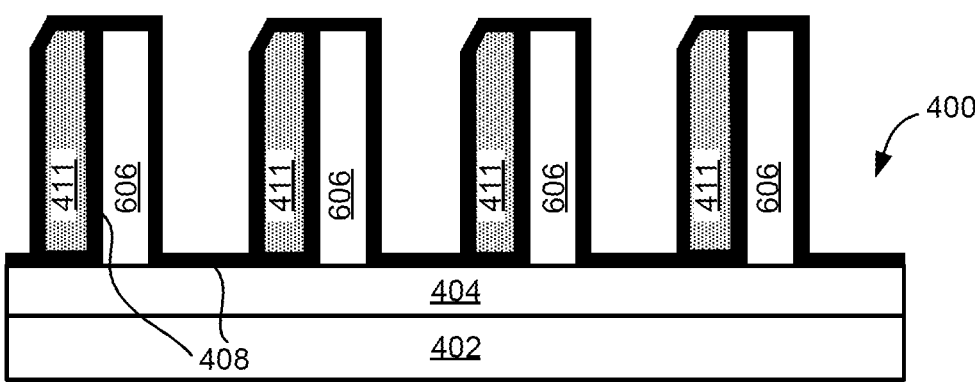
FIG. 6F1

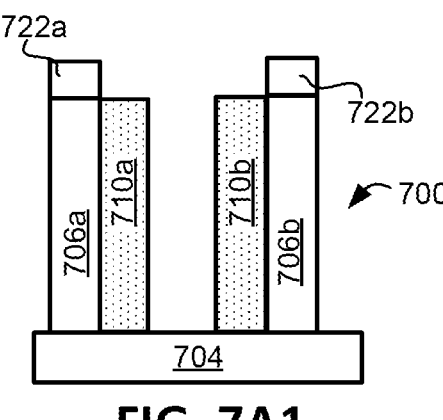
FIG. 7A1
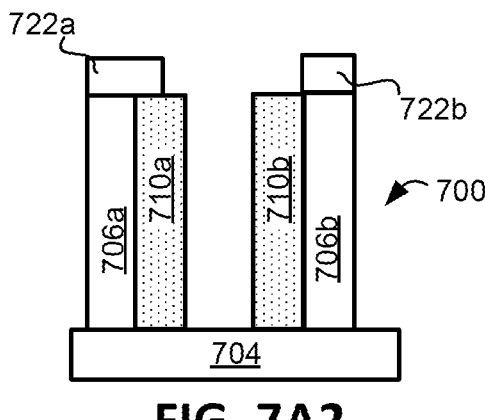
FIG. 7A2
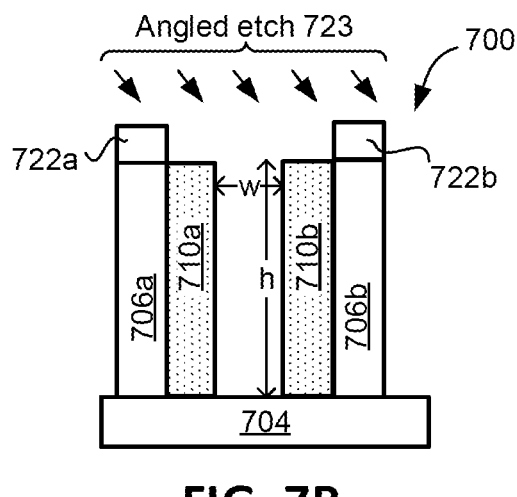
FIG. 7B
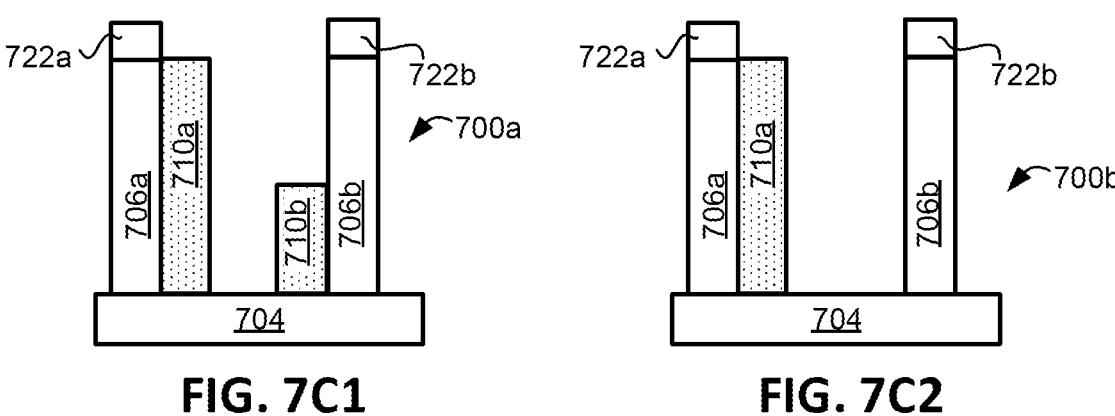
FIG. 7C1
FIG. 7C2

METAL SPACERS WITH HARD MASKS FORMED USING A SUBTRACTIVE PROCESS

FIELD OF THE DISCLOSURE

The present disclosure relates to integrated circuits, and more particularly, to interconnect features for signal routing.

BACKGROUND

As integrated circuits continue to scale downward in size, a number of challenges arise. For instance, it is becoming increasingly difficult to support high density of scaled interconnect features. In an example, subtractive metal etch can be used to form interconnect features. However, there are several challenges in achieving high density scaled interconnect features using subtractive metal etch process.

BRIEF DESCRIPTION OF THE DRAWINGS

FIG. 2 illustrates a flowchart depicting a method of forming an IC (such as the IC of FIG. 1B) comprising (i) a plurality of conductive first interconnect features, (ii) a plurality of conductive second interconnect features, wherein individual ones of the plurality of conductive second interconnect features are above and on corresponding ones of first one or more of the first interconnect features, (iii) a plurality of non-conductive first features, wherein individual ones of the plurality of non-conductive first features are above and on corresponding ones of second one or more of the plurality of conductive first interconnect features, and (iv) a plurality of non-conductive second features, wherein individual ones of the plurality of non-conductive second features are above and on corresponding ones of third one or more of the plurality of conductive first interconnect features, and in accordance with an embodiment of the present disclosure.

FIG. 5 illustrates a flowchart depicting a method of forming an IC (such as the IC of FIG. 4) comprising a plurality of conductive first interconnect features interleaved with a plurality of conductive second interconnect features, the conductive first interconnect features comprising a first conductive material and the second interconnect features comprising a second conductive material, wherein the first conductive material and the second conductive material are elementally different and have different electrical conductivity, in accordance with an embodiment of the present disclosure.

FIGS. 6A, 6B, 6C, 6D, 6E, 6F, 6F1, 6G, 6H, 6I, 6J, 6K, 6L, 6M, and 6N illustrate cross-sectional views of an IC (such as the IC of FIG. 4) in various stages of processing, in accordance with an embodiment of the present disclosure.

FIGS. 7A1, 7A2, 7B, 7C1, and 7C2 illustrate cross-sectional views of an IC in various stages of processing, where processing of the IC includes using an angled etch process, in accordance with an embodiment of the present disclosure.

Figure 1A:
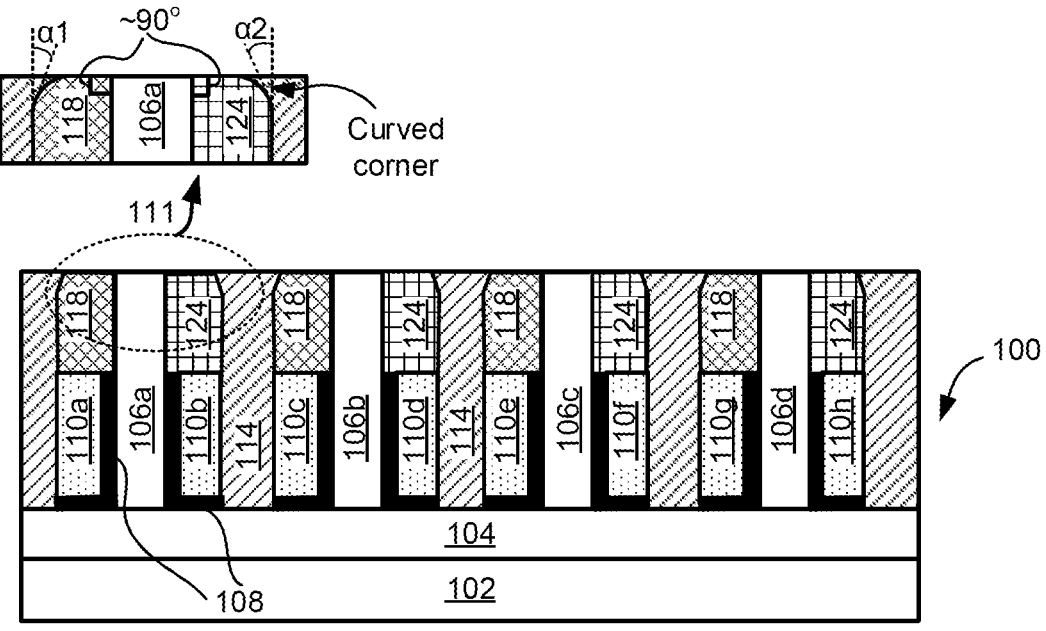
FIG. 1A illustrates a cross-sectional view of a section of an integrated circuit (IC) comprising (i) a plurality of conductive interconnect features, (ii) a plurality of non-conductive first features, wherein individual ones of the plurality of non-conductive first features are above and on corresponding ones of a first subset of the plurality of conductive interconnect features, and (iii) a plurality of non-conductive second features, wherein individual ones of the plurality of non-conductive second features are above and on corresponding ones of a second subset of the plurality of conductive interconnect features, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Provided herein are integrated circuit structures comprising interconnect features that are formed using a subtractive metal etch process. Although the techniques can be used to form any number of interconnect structures, they are particularly well-suited to forming high density interconnect structures. In one embodiment, an integrated circuit device includes a first interconnect layer, and a conductive first interconnect feature and a conductive second interconnect feature laterally separated by a body of insulating or semiconductor material. In an example, the first and second interconnect features are above the first interconnect layer. In an example, the first and second interconnect features are formed using a subtractive metal etch process. The integrated circuit device further includes a non-conductive feature above and on the first interconnect feature, and a conductive third interconnect feature above and on the second interconnect feature. In an example, the non-conductive feature may be at least in part formed using an angled etch process (e.g., a lateral reactive ion etch process). The integrated circuit device also includes a second interconnect layer above the non-conductive feature and third interconnect features. In an example, the second and third interconnect features conductively couple the first and second interconnect layers.

In another embodiment, an integrated circuit device includes a first interconnect layer, and a plurality of conductive first interconnect features interleaved with a plurality of conductive second interconnect features. In an example, the plurality of conductive first interconnect features comprises first conductive material, and the plurality of conductive second interconnect features comprises second conductive material. In an example, the first conductive material has a first electrical conductivity that is different (e.g., at least 10% higher or lower) from a second electrical conductivity of the second conductive material. In an example, the integrated circuit device also includes a second interconnect layer above the plurality of conductive first interconnect features and the plurality of conductive second interconnect features.

In yet another embodiment, a method of forming an integrated circuit comprises forming (i) a first conductive interconnect feature on a first side of a bottom section of a body, and (ii) a second conductive interconnect feature on a second side of the bottom section of the body. In an example, the body comprising non-conductive material. In an example, the method further comprises forming (i) a first non-conductive feature on the first side of a top section of the body, and (ii) a second non-conductive feature on the second side of the top section of the body. In an example, the first non-conductive feature is on and above the first conductive interconnect feature, and the second non-conductive feature is on and above the second conductive interconnect feature. In an example, the method further comprises removing the second non-conductive feature, without removing the first non-conductive feature, the first conductive interconnect feature, and the second conductive interconnect feature. In an example, removing the second non-conductive feature comprises directing reactive ions at an angle (e.g., which is substantially different from a right angle) towards the first non-conductive feature, the second non-conductive feature, and the body. In an example, the reactive ions facilitate etching of the second non-conductive feature, and the body shadows the first non-conductive feature from the reactive ions and prevents substantial etching of the first non-conductive feature. In an example, the method further comprises forming (i) a third non-conductive feature on the first non-conductive feature that is on the first side of the top section of the body, and (ii) and a fourth non-conductive feature on the second side of the top section of the body, where the fourth non-conductive feature is on and above the second conductive interconnect feature. In an example, the method further comprises removing the third non-conductive feature, without removing the first non-conductive feature, the fourth non-conductive feature, the first conductive interconnect feature, and the second conductive interconnect feature. In an example, removing the third non-conductive feature comprises directing reactive ions at an angle (e.g., which is substantially different from a right angle) towards the third non-conductive feature, the fourth non-conductive feature, and the body, where the reactive ions facilitate etching of the third non-conductive feature, and where the body shadows the fourth non-conductive feature from the reactive ions and prevents substantial etching of the fourth non-conductive feature. Numerous variations, embodiments, and applications will be apparent in light of the present disclosure.

General Overview

As previously noted, with increased scaling of microelectronic devices, it is becoming increasingly difficult to support high density of scaled interconnect features. There are several challenges in achieving high density scaled interconnect features using subtractive metal etch process, such as aligning the interconnect features. Additionally, due to the high density of interconnect features, it may be difficult to open and process a bottom interconnect feature for forming a top interconnect feature thereon, without substantially etching or affecting an adjacent bottom interconnect feature.

Accordingly, techniques are provided herein to form interconnect features using subtractive etch process and angled etch process. For example, initially, a plurality of conductive bottom interconnect features is formed. The conductive bottom interconnect features are formed in pairs, where each pair of bottom interconnect features are on two sides of a non-conductive body. For example, the bottom interconnect features are formed using subtractive metal etch process, where conductive material (such as metal) are conformally deposited on the body, and then etched to define the bottom interconnect features. In an example, the bottom interconnect features and the body and on and above a bottom interconnect layer.

Subsequently, first non-conductive material is conformally deposited and then etched, to form first non-conductive features on both sides of individual body. Thus, each first feature in on and above a corresponding bottom interconnect feature. Note that conformal deposition process is used to form the first features, resulting in detectable slightly curved top corners in the first features. Subsequently, an angled etch process is employed, to remove the first features from a first side of each body, without removing the first features from a second side of each body. In the angled etch process (also referred to as lateral reactive ion etch process, or lateral RIE process), the reactive ions hit the wafer at an angle different from a right angle. For example, the reactive ions hit the wafer from the first side, thereby removing the first features from a first side of each body. Each body shadows the first features that are on the second side of the corresponding body, and hence, the first features from second side of each body are not removed.

Subsequently, second non-conductive material is conformally deposited and then etched, to form second non-conductive features on both sides of individual body. Subsequently, another angled etch process is employed, to remove the second features from the second side of each body, without removing the second features from the first side of each body. Note that conformal deposition process is used to form the second features, resulting in detectable slightly curved top corners in the second features.

Thus, after the two angled etch process, the first features comprising the first non-conductive material are above and on the bottom interconnect features that are on the second side of the bodies, and the second features comprising the second non-conductive material are above and on the bottom interconnect features that are on the first side of the bodies. Thus, if a first and a second bottom interconnect features are adjacent to each other, the first bottom interconnect feature will have one of the first or second non-conductive feature formed on and above the first bottom interconnect feature, and the second bottom interconnect feature will have the other of the first or second non-conductive feature formed on and above the second bottom interconnect feature. Put differently, no two adjacent bottom interconnect features will have the first non-conductive features formed thereon, or will have the second non-conductive features formed thereon. Thus, the first and second non-conductive features are arranged in an interleaved or alternate manner.

In one embodiment, the first non-conductive material of the first features and the second non-conductive material of the second features are different, e.g., etch selective relative to each other. Thus, an etch process to remove the first non-conductive material does not substantially etch the second non-conductive material, and similarly, an etch process to remove the second non-conductive material does not substantially etch the first non-conductive material.

In an example, the first and second non-conductive features are hard masks that protect the bottom interconnect feature formed underneath these non-conductive features. In one embodiment, during subsequent processing of the wafer, one or more of the first and second non-conductive features are removed (e.g., etched) and replaced by top interconnect features. It may be noted that in an example, only some, but not all of the first and second non-conductive features are replaced by the top interconnect features. Because the first non-conductive material of the first features and the second non-conductive material of the second features are etch selective relative to each other, a removal process (e.g., an etch process) to remove a first feature does not substantially etch adjacent second features. Accordingly, even though the bottom interconnect features are formed at high density (e.g., with tight pitch), one or more of the first features and one or more of the second features may be selectively removed, without substantially etching any adjacent first or second features.

Thus, put differently, in an example, the first and second features may be thought to be color coded—where each first feature is coded or symbolically associated with a first color, and each second feature is coded or symbolically associated with a second color. Note that these are symbolic colors and do not represent an actual color of the physical first and second features. The color-coded first and second features are hard mask protecting the underlying conductive bottom interconnect features. As discussed, the first and second color-coded features are interleaved, e.g., alternately arranged. Because of the etch selectivity between first and second features, a feature of the first color may be removed and replaced by a corresponding top interconnect feature, without affecting (e.g., substantially etching) the adjacent feature of the second color. Similarly, a feature of the second color may be removed and replaced by a corresponding top interconnect feature, without affecting (e.g., substantially etching) the adjacent feature of the first color.

As discussed, conformal deposition process is used to form the first and second features, resulting in detectable slightly curved top corners in the first and second features. As each top interconnect feature is formed by replacing a corresponding one of the first or second feature, the top interconnect features may also include the detectable slightly curved top corners.

Also, as each top interconnect feature is formed by replacing a corresponding one of the first or second feature, each top interconnect feature is formed above and on a corresponding bottom interconnect feature. Subsequently, a top interconnect layer is formed above the top interconnect features and the non-conductive first and second features. A combination of a top interconnect feature and corresponding a bottom interconnect feature form a conductive via between the top interconnect layer and the bottom interconnect layer. For example, a plurality of such combination forms a corresponding plurality of conductive vias between the top interconnect layer and the bottom interconnect layer.

Note that not all bottom interconnect features have corresponding top interconnect features formed thereon. For example, as discussed, some of the bottom interconnect features will still have either the non-conductive first feature or the non-conductive second feature formed thereon. Such bottom interconnect features, thus, will not be conductively coupled to the top interconnect layer, and will not have any functional role in the IC.

In some other embodiments, techniques are also provided herein to form first and second interconnect features using subtractive etch process and angled etch process, where (i) one or more first interconnect features are used to form thin film resistors, (ii) one or more second interconnect features are used to form interconnections between a top interconnect layer and a bottom interconnect layer, and (iii) third one or more of the first and second interconnect features may be non-functional and not conductively coupled to one or both the top and bottom interconnect layers.

For example, a plurality of sacrificial bodies is formed above and on a bottom interconnect layer. A plurality of first conductive interconnect features are formed on a first side of the bodies, e.g., using the previously discussed subtractive etch process and angled etch. Subsequently, a plurality of second conductive interconnect features are formed on a second side of the bodies, e.g., using the previously discussed subtractive etch process and angled etch. Thus, each body has a first conductive interconnect feature of a first side and a second conductive interconnect feature on a second side. In one embodiment, because the plurality of first and second interconnect features are conformally deposited on both sides of the bodies, top corners of individual ones of the first and second interconnect features have curved corners.

In one embodiment, the plurality of first conductive interconnect features comprise first conductive material, and the plurality of second conductive interconnect features comprise second conductive material. In an example, the first conductive material and the second conductive material are different and have different electrical conductivity. For example, the electrical conductivity of the first and second conductive materials differ by at least 5%, or at least 10%, or at least 20%. Merely as an example, one of the first and second conductive materials comprise an appropriate metal (e.g., ruthenium) and the other of the first and second conductive materials comprise an appropriate metal oxide or metal nitride (e.g., titanium nitride).

A top interconnect layer comprising vias are formed above the plurality of first and second conductive interconnect features. Note that the bodies may be removed prior to forming the top interconnect layer in an example, while in another example the bodies are not removed.

At least some of the plurality of first and second conductive interconnect features are conductively coupled to the bottom and top interconnect layers. Because the electrical conductivity of the first and second interconnect features are different, the lower conductive first interconnect features may be used to form thin film resistors, whereas the higher conductive second interconnect features may be used to form interconnections the bottom and top interconnect layers. Thus, an intermediate interconnect layer (e.g., which is between the bottom and top interconnect layers) comprises the plurality of first and second conductive interconnect features, where the intermediate interconnect layer includes both thin film resistors and the interconnections between the bottom and top interconnect layers.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a plurality of bottom interconnect features, with first non-conductive features above and on first one or more of the plurality of bottom interconnect features, second non-conductive features above and on second one or more of the plurality of bottom interconnect features, and one or more top interconnect features on third one or more of the plurality of bottom interconnect features. In some such embodiments, such tools may also be used to detect curved top corners of the first non-conductive features, second non-conductive features, and the top interconnect features, as discussed herein. In some other embodiments, such tools may also be used to detect an intermediate interconnect layer comprising (i) interconnect features conductively coupling a top interconnect layer and a bottom interconnect layer, and (ii) thin film resistors between the top interconnect layer and the bottom interconnect layer, where each of the interconnect features and the thin film resistors has a top corner that is slightly curved. Numerous configurations and variations will be apparent in light of this disclosure.

Architecture and Methodology

Figure 1B:
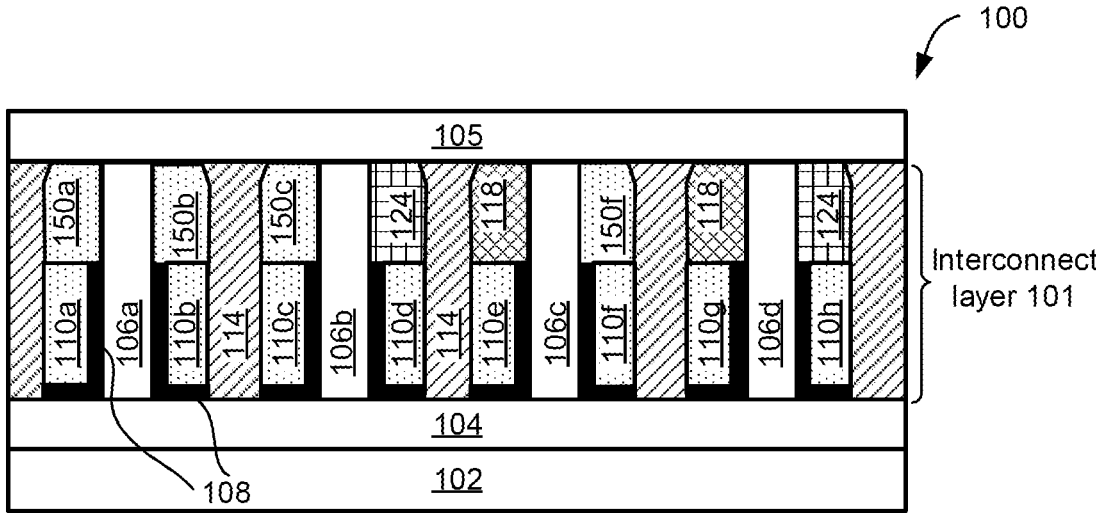
FIG. 1B illustrates a cross-sectional view of a section of the IC of FIG. 1A, wherein the plurality of conductive interconnect features is a plurality of conductive first interconnect features, and wherein one or more of the plurality of non-conductive first features and one or more of the plurality of non-conductive second features are replaced by corresponding ones of conductive second interconnect features, in accordance with an embodiment of the present disclosure.

FIG. 1A illustrates a cross-sectional view of a section of an integrated circuit (IC) 100 comprising (i) a plurality of conductive first interconnect features 110, (ii) a plurality of non-conductive first features 118, wherein individual ones of the plurality of non-conductive first features 118 are above and on corresponding ones of a first subset of the plurality of conductive first interconnect features 110, and (iii) a plurality of non-conductive second features 124, wherein individual ones of the plurality of non-conductive second features 124 are above and on corresponding ones of a second subset of the plurality of conductive first interconnect features 110, in accordance with an embodiment of the present disclosure. FIG. 1B illustrates a cross-sectional view of a section of the IC 100 of FIG. 1A, wherein one or more of the plurality of non-conductive first features 118 and one or more of the plurality of non-conductive second features 124 are replaced by corresponding ones of conductive second interconnect features 150, in accordance with an embodiment of the present disclosure.

Referring to FIG. 1A, in an example, the IC 100 comprises a layer 102, which may be interlayer dielectric (ILD) material, above which the various features 110, 118, 124 are formed. In another example, the layer 102 comprises an interconnect layer comprising a plurality of interconnect features within dielectric material of the interconnect layer. In yet another example, the layer 102 is representative of a device layer of the IC 100 comprising one or more active and/or passive devices, such as transistors. Thus, the layer 102 is symbolic of any component(s) of the IC 100 below the various features 110, 118, and 124, and is implementation specific.

A layer 104 is between the layer 102 and the features 110, 118, 124. In one embodiment, the layer 104 is an interconnect layer comprising a plurality of interconnect features (such as conductive lines and/or conductive vias) within dielectric material of the interconnect layer.

Note that the plurality of conductive first interconnect features 110 are below the plurality of conductive second interconnect features 150, see FIG. 1B. Accordingly, for ease of identification, the first interconnect features 110 are also referred to as bottom interconnect features 110 (or simply as interconnect features 110), and the second interconnect features 150 are also referred to as top interconnect features 150 (or simply as interconnect features 150).

Referring again to FIG. 1A, in one embodiment, the plurality of first interconnect features 110 are in pairs, and two interconnect features 110 in a pair are separated by a corresponding body 106. For example, as illustrated in FIG. 1A, interconnect features 110a and 110b are a pair of interconnect features that are separated by a corresponding body 106a, interconnect features 110c and 110d are another pair of interconnect features that are separated by another corresponding body 106b, and so on. Although merely 4 pairs, or 8 interconnect features 110a, . . . , 110h are illustrated with 4 corresponding bodies 106a, . . . , 106d, such a number of interconnect features 110 and a number of corresponding bodies 106 are mere examples, and in one implementation, the IC 100 is likely to have many more such interconnect features 110.

In one embodiment, the interconnect features 110 comprise conductive material. For example, the interconnect features 110 comprise metal. In an example, the interconnect features 110 comprise conductive material, such as ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material.

In one embodiment, the bodies 106 comprise non-conductive material, such as insulator, dielectric, or semiconductor material. Any appropriate nonconductive material may be used for the bodies 106, such as amorphous silicon, silicon oxide, silicon nitride, or another appropriate oxide or nitride. As will be discussed herein with respect to FIGS. 2 and 3A-3C, a body 106 is used as a backbone to form two corresponding adjacent interconnect features 110. Accordingly, the bodies 106 are also referred to herein as backbone structures.

In one embodiment, a conformal liner layer 108 is between individual body 106 and adjacent interconnect features 110. In an example, individual interconnect features 110 has opposite left and right sidewalls, and the liner layer 108 is on a sidewall of an interconnect feature 110 facing the corresponding body 106.

For example, the liner layer 108 is between a right sidewall of the interconnect feature 110*a* and the corresponding body 106*a*, and is also between a left sidewall of the interconnect feature 110*b* and the corresponding body 106*a*. However, the liner layer 108 is not on a left sidewall of the interconnect feature 110*a* and also not on a right sidewall of the interconnect feature 110*b*.

In an example, the liner layer 108 facilitates better adhesion of the conductive material of the interconnect features 110 to the adjacent body 106 and the layer 104, e.g., during deposition of the conductive material of the interconnect features 110. In an example, the liner layer 108 may also act as a barrier layer, to prevent diffusion of the conductive material (such as copper) of the interconnect features 110 to adjacent material of the body 106 and/or the layer 104.

In an example, the liner layer 108 has a thickness in the range of 1 to 5 nanometers (nm), or 1 to 10 nm, or 0.5 to 20 nm, or 3 to 20 nm. In an example, the liner layer 108 has a thickness of at least 1 nm, or at least 3 nm, or at least 5 nm, or at least 7 nm. In an example, the liner layer 108 has a thickness of at most 5 nm, or at most 10 nm, or at most 20 nm, or at most 30 nm. Suitable materials for the liner layer 108 include liner layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). Although illustrated in the figures, in an example, the liner layer 108 may be absent from the IC 100.

In one embodiment and as illustrated in FIG. 1A, individual interconnect feature 110 has a corresponding non-conductive feature formed thereon. For example, non-conductive features 118 are formed above and on the interconnect features 110*a*, 110*c*, 110*e*, 110*g*, and non-conductive features 124 are formed above and on the interconnect features 110*b*, 110*d*, 100*f*, 110*h*. Note that in FIG. 1B, one or more of the non-conductive features 118 and one or more of the non-conductive features 124 are eventually replaced with corresponding conductive interconnect features 150, as will be discussed herein in turn.

In one embodiment, the features 118 and 124 are interleaved, such that individual ones of the features 118, 124 are arranged in an alternating manner, as illustrated in FIG. 1A. For example, a feature 118 is between two features 124, and similarly, a feature 124 is between two features 118.

In an example, the various interconnect feature 110, and the non-conductive features 118, 124 are encapsulated by dielectric material 114. For example, the dielectric material 114 acts as an ILD material in the IC 100.

In one embodiment, as discussed, the features 118, 124 comprise non-conductive material. In an example, the non-conductive features 118, the non-conductive features 124, and the dielectric material 114 are etch selective to each other. For example, an etch process to etch and remove a feature 118 may not substantially etch adjacent features 124 and the dielectric material 114. Similarly, an etch process to etch and remove a feature 124 may not substantially etch adjacent features 118 and the dielectric material 114.

Different combination of material may be used for the dielectric material 114, the non-conductive features 118, and the non-conductive features 124. Merely as an example, the dielectric material 114, the non-conductive features 118, and/or the non-conductive features 124 may be different (e.g., etch selective relative to each other), and may comprise one or more of silicon oxide, silicon nitride, an appropriate oxide and/or nitride (e.g., a metal oxide or metal nitride) such as hafnium oxide, zirconium oxide, titanium oxide, titanium nitride, and/or another appropriate non-conductive or dielectric material. Merely as an example, the dielectric material 114 may be silicon oxide, the features 118 may be hafnium oxide, and the features 124 may be titanium oxide, where the dielectric material 114, the features 118, and the features 124 are etch selective relative to each other. In another example, one of the features 118 or 124 may be silicon oxide, and the other of the features 118 or 124 may be hafnium oxide. In another example, one of the features 118 or 124 may be titanium oxide, and the other of the features 118 or 124 may be hafnium oxide. In another example, one of the features 118 or 124 may be titanium nitride, and the other of the features 118 or 124 may be hafnium oxide. Other combinations may also be possible.

In one embodiment, a top section of each of the features 118, 124 comprises a corner between a sidewall and the top wall of the feature, where the corner is substantially curved. For example, the corner between the top surface and a sidewall of individual features 118, 124 (where the sidewall is not facing the corresponding body 106) is curved. For example, the corner is not substantially at a right angle, e.g., not within 10 degrees of a right angle. For example, FIG. 1A illustrates a magnified view of a feature 118 and a feature 124 around the body 106*a*. As illustrated, a top left corner of the feature 118 is curved. For example, a section of the curved corner of the feature 118 is at an angle α1 relative to the sidewall of the feature 118, where α1 is substantially different from 90 degrees. For example, α1 is less than 85 degrees, or less than 80 degrees, or less than 75 degrees. Similarly, a section of the curved top right corner of the feature 124 is at an angle α2 relative to the sidewall of the feature 124, where α2 is less than 85 degrees, or less than 80 degrees, or less than 75 degrees. The curved corners of the features are result of conformal deposition of the features 118, 124 during formation of the IC 100, as will be discussed herein later with respect to FIGS. 3G, 3H, 3K, and 3L herein in turn. In an example, the curved corners of the features 118, 124 have shapes that are similar to shapes of curved gate spacers in a transistor, such as a finFET transistor.

In contrast, a top section of each of the features 118, 124 also comprises another corner that is at substantially a right angle (e.g., within 5 or 10 degrees of 90 degrees), as also illustrated in the magnified view of the section 111. For example, the top right corner of the feature 118 and the top left corner of the feature 124 are substantially at right angles.

Referring now to FIG. 1B, one or more of the plurality of non-conductive first features 118 and one or more of the plurality of non-conductive second features 124 of the IC 100 of FIG. 1A are replaced by corresponding ones of conductive second interconnect features 150 in the IC 100*a* of FIG. 1B. Thus, the IC 100*a* of FIG. 1B is formed from the IC 100*a* of FIG. 1A (see FIGS. 3P-3S discussed herein later for formation of the IC 100*a* from the IC 100).

In the IC 100*a* of FIG. 1B, a conductive interconnect feature 150*a* is on the conductive interconnect feature 110*a*, and the combination of interconnect features 150*a* and 110*a* form a combined interconnect feature that forms a conductive path between the interconnect layers 104 and 105. Similarly, for example, a conductive interconnect feature 150*f* is on the conductive interconnect feature 110*f*, and the combination of interconnect features 150*f* and 110*f* form a combined interconnect feature that forms a conductive path between the interconnect layers 104 and 105.

Thus, there are a plurality of combined interconnect features between the interconnect layers 104, 105. The plurality of combined interconnect features forms an interconnect layer 101 between the interconnect layers 104, 105, as labelled in FIG. 1B. Thus, the interconnect layer 101 comprises a plurality of combined interconnect features, such as a first combined interconnect feature that is a combination of interconnect features 110*a*, 150*a*, a second combined interconnect feature that is a combination of interconnect features 110*b*, 150*b*, a third combined interconnect feature that is a combination of interconnect features 110*c*, 150*c*, and a fourth combined interconnect feature that is a combination of interconnect features 110*f*, 150*f*. Each combined interconnect feature, in essence, is a conductive via extending through the dielectric material 114 of the interconnect layer 101. In one embodiment, each combined interconnect feature conductively couples a corresponding interconnect feature (such as a conductive line or via) of the interconnect layer 104 with a corresponding interconnect feature (such as a conductive line or via) of the interconnect layer 105.

Note that not all of the plurality of conductive interconnect features 110 are used to couple the interconnect layers 104, 105. For example, the interconnect feature 110*d* has a non-conductive feature 124 formed thereon. Thus, the combination of features 110*d* and 124 does not form a conductive pathway between the interconnect layers 104, 105. Accordingly, for example, the interconnect feature 110*d* may be electrically isolated from the layers 104 and/or 105. In another example, the interconnect feature 110*d* may be electrically floating (e.g., in case the interconnect feature 110*d* is coupled to the layer 104). The interconnect feature 110*d* does not play any functional role in the IC 100*a*. Similarly, interconnect features 110*e*, 110*g*, 110*h*, on which non-conductive features 118 or 124 are formed, does not have any functional role in the IC 100*a*, e.g., does not conductively couple the interconnect layers 104, 105.

In an example, the interconnect features 110 are formed with a relatively tight pitch. For example, the pitch of the bodies 106 are in the range of 10-50 nm, and a pitch of the interconnect features 110 are about half of that, e.g., in the range of 5-25 nm. In an example, two adjacent bodies 106 are laterally separated by at most 30 nm, at most 50 nm, at most 100 nm, or at most 150 nm. Thus, interconnect features 110 may be formed uniformly (or about uniformly, or non-uniformly), with a high density, between the interconnect layers 104, 105. Only some of the interconnect features 110 are to be used to conductively couple the interconnect layers 104, 105.

Accordingly, in the IC 100 of FIG. 1A, each interconnect feature 110 is covered by a corresponding one of the non-conductive features 118, 124. In the IC 100*a* of FIG. 1B, only some of the non-conductive features 118, 124 are removed and replaced by the corresponding conductive interconnect features 150.

In an example, during replacing a feature 118 with a corresponding conductive interconnect feature 150, generally, it may be difficult to etch and remove a non-conductive feature 118 without somewhat etching an adjacent nonconductive feature 124, e.g., because of the tight pitch of the interconnect features 110 and because of unintended technical limitations inherent in the etching process. Similarly, during replacing a feature 124 with a corresponding conductive interconnect feature 150, generally, it may be difficult to etch and remove the non-conductive feature 124 without somewhat etching an adjacent non-conductive feature 118.

However, as discussed herein previously, in the IC 100*a*, the non-conductive features 118 and the non-conductive features 124, and the dielectric material 114 are etch selective to each other. For example, an etch process to etch and remove the features 118 may not substantially etch the features 124 and the dielectric material 114. Similarly, an etch process to etch and remove the features 124 may not substantially etch the features 118 and the dielectric material 114. Thus, due to the etch selectivity between the non-conductive features 118, the non-conductive features 124, and the dielectric material 114, it may be possible to etch and remove any of the non-conductive features 118 or 124, without substantially affecting adjacent ones of the non-conductive features 118 or 124.

Thus, the features 118 and 124 may be thought to be color coded—where each feature 118 is coded or symbolically associated with a first color, and each feature 124 is coded or symbolically associated with a second color. Note that these are symbolic colors and do not represent an actual color of the physical features 118, 124. In FIG. 1A, the color-coded features 118, 124 are hard masks protecting the conductive interconnect features 110 underneath. The first and second color-coded masks 118, 124 are interleaved, e.g., alternately arranged. Because of the etch selectivity between hard masks 118, 124 of the two colors, a hard mask 118 of the first color may be removed and replaced by a corresponding interconnect feature 150, without affecting (e.g., substantially etching) the adjacent hard masks 124 of the second color. Similarly, a hard mask 124 of the second color may be removed and replaced by a corresponding interconnect feature 150, without affecting (e.g., substantially etching) the adjacent hard masks 118 of the first color. Note that conformal deposition and subtractive metal etch process is used to form the spacer like interconnect features 110, 150 and the features 118, 124, resulting in the slightly curved top corners in the features 118, 124 and interconnect features 150. Thus, the interconnect features 110 are like metal spacers, with hard masks 118, 124 formed thereon.

Figures 3A, 3B, 3C, 3D:
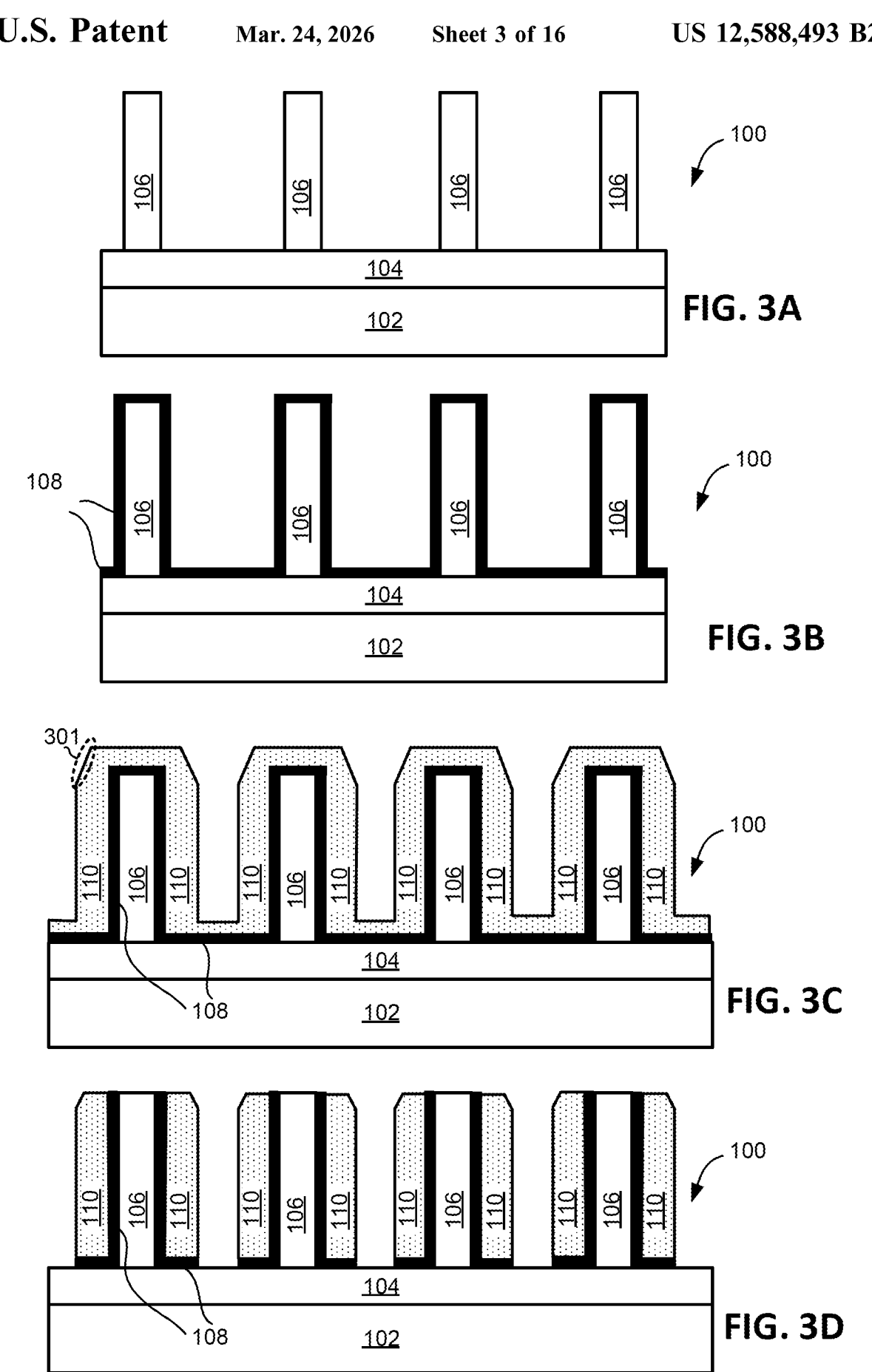
FIGS. 3A-3S illustrate cross-sectional views of an IC (such as the ICs of FIGS. 1A and 1B) in various stages of processing, in accordance with an embodiment of the present disclosure.
Figures 3E, 3F, 3G, 3H:
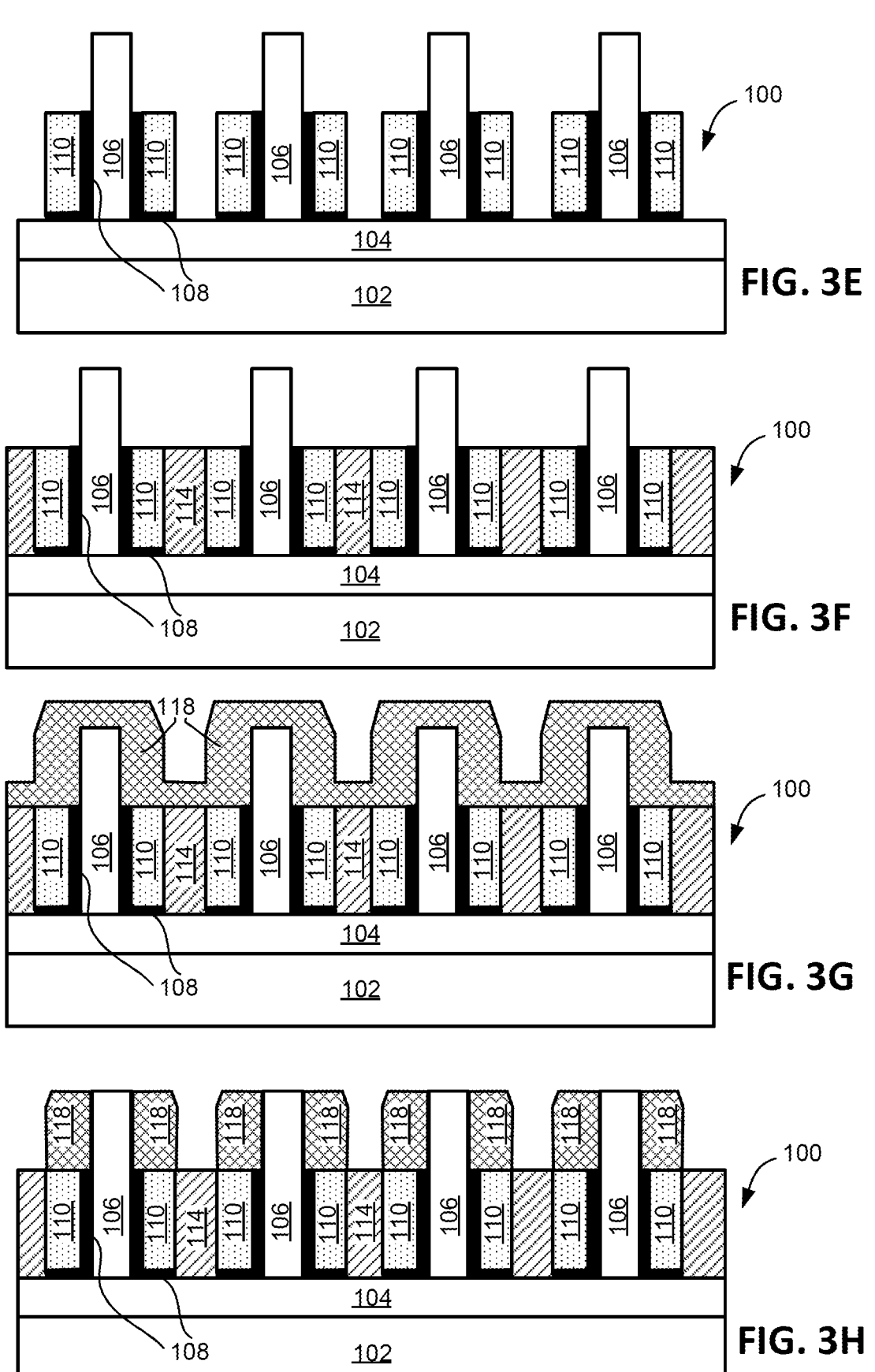

FIG. 2 illustrates a flowchart depicting a method 200 of forming an IC (such as the IC 100*a* of FIG. 1B) comprising (i) a plurality of conductive first interconnect features 110, (ii) a plurality of conductive second interconnect features 150, wherein individual ones of the plurality of conductive second interconnect features 150 are above and on corresponding ones of first one or more of the first interconnect features 110, (iii) a plurality of non-conductive first features 118, wherein individual ones of the plurality of non-conductive first features 118 are above and on corresponding ones of second one or more of the plurality of conductive first interconnect features 110, and (iv) a plurality of non-conductive second features 124, wherein individual ones of the plurality of non-conductive second features 124 are above and on corresponding ones of third one or more of the plurality of conductive first interconnect features 110, and in accordance with an embodiment of the present disclosure. FIGS. 3A-3S illustrate cross-sectional views of an IC (such as the IC 100 and IC 100*a* of FIGS. 1A and 1B) in various stages of processing, in accordance with an embodiment of the present disclosure. FIGS. 2 and 3A-3S will be discussed in unison.

Referring to FIG. 2, the method 200 includes, at 204, forming a plurality of bodies 106 above an interconnect layer 104. FIG. 3A illustrates the bodies 106 above and on the interconnect layer 104. As previously discussed herein, in one embodiment, the bodies 106 comprise non-conductive material. Any appropriate nonconductive insulator or semiconductor material may be used for the bodies 106, such as amorphous silicon, silicon oxide, silicon nitride, or another appropriate oxide or nitride. A body 106 is used as a backbone to form two corresponding adjacent interconnect features 110. In an example, the bodies 106 may be formed using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example.

Referring again to FIG. 2, the method 200 then proceeds from 204 to 208, where liner layer 108 is conformally deposited on the interconnect layer 104 and the bodies 106, followed by conformal deposition of conductive material layer 110 on the interconnect layer 104 and the bodies 106. For example, FIG. 3B illustrates conformal deposition of the liner layer 108 on the interconnect layer 104 and the bodies 106. As previously discussed herein, the liner layer 108 facilitates better adhesion of the conductive material 110 to the adjacent body 106. In an example, the liner layer 108 may also act as a barrier layer, to prevent diffusion of the conductive material of the interconnect features 110 to adjacent material of the body 106 and/or the layer 104 (e.g., in case the conductive material is copper). In another example and although not illustrated in the figures, the liner layer 108 may not be deposited, and instead of the conductive material layer 108 may be deposited directly on the interconnect layer 104 and the bodies 106. The deposition process can be followed by an appropriate annealing process. Suitable materials for the liner layer 108 include liner layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

In an example, the conductive material layer 110 comprises an appropriate conductive material that may be used to form interconnect features, such as ruthenium, molybdenum, tungsten, aluminum, pure copper, an alloy such as copper-tin (CuSn), copper indium (CuIn), copper-antimony (CuSb), copper-bismuth (CuBi), copper-rhenium (CuRe), and/or any other suitable conductive material. In an example, the conductive material layer 110 may be deposited using an electroless process, CVD, PVD, ALD, VPE, MBE, or LPE, for example, and in some such examples, the conductive material layer 110 may not comprise copper, e.g., may comprise ruthenium, molybdenum, or tungsten, for example. In other examples, an electroplating process may be used for the deposition of the conductive material 110, and in some such examples, the conductive material layer 110 may comprise copper.

In an example, due to the conformal deposition of the conductive material 110 on the bodies 106, the conductive material 110 on the sidewalls of the bodies 106 have corners that are curved, e.g., not perpendicular with the sidewalls.

Such a curved corner is illustrated within the dotted oval shape 311 and has also been discussed with respect to FIG. 1A.

Referring again to FIG. 2, the method 200 proceeds from 208 to 212, where horizontal sections of the conductive material layer 110 are removed, followed by removal of the top sections of the conductive material layer 110, such that the conductive material layer 110 are on sidewalls of bottom sections of the bodies 106. FIG. 3D illustrates removal of the horizontal sections of the conductive material layer 110, and FIG. 3E illustrates removal of the top sections of the conductive material layer 110, such that the conductive material layer 110 are on sidewalls of bottom sections of the bodies 106. It may be noted that in an example, along with removal of a section of the conductive material layer 110, the underlying liner layer 108 is also removed, as illustrated in FIGS. 3D and 3E. In one embodiment, the removal discussed with respect to process 212 may be performed using an appropriate etching technique. As illustrated in FIG. 3E, the conductive material layer 110, subsequent to the above discussed removal, forms the plurality of interconnect features 110.

Referring again to FIG. 2, the method 200 proceeds from 212 to 216, where dielectric material 114 are deposited between the interconnect features 110, and the dielectric material 114 is etched back, such that the top surfaces of the dielectric material 114 and the interconnect features 110 are coplanar, as also illustrated in FIG. 3F. The dielectric material 114 may be deposited using an appropriate deposition technique, such as CVD, PVD, ALD, VPE, MBE, or LPE, for example. The etch back of the dielectric material 114 may be performed using an appropriate etching technique, such as an isotropic etching process.

Referring again to FIG. 2, the method 200 proceeds from 216 to 220, where non-conductive material layer 118 is conformally deposited on the IC 100, and subsequently horizontal surfaces of the material layer 118 are removed, to thereby form a plurality of non-conductive features 118. FIG. 3G illustrates the non-conductive material layer 118 conformally deposited on the IC 100, and FIG. 3H illustrates the plurality of non-conductive features 118 after removal of the horizontal surfaces of the material layer 118. The non-conductive material layer 118 may be deposited using an appropriate deposition technique, such as CVD, PVD, ALD, VPE, MBE, or LPE, for example. The selective removal of the non-conductive material layer 118 may be performed using an appropriate etching technique, such as a Reactive Ion Etch (RIE) process, e.g., an isotropic etching process. In an example, the etching process may also slightly etch sections of the vertical sidewalls of the material layer 118. But the deposition technique (such as ALD) to deposit the material layer 118 results in the vertical sidewalls being thicker than the horizontal surfaces, and hence, after the horizontal surface removal, sections of the vertical sidewalls of the material layer 118 remains on the bodies 106, as illustrated in FIG. 3H.

Note that in FIG. 3H, the non-conductive features 118 are on both left and right sides of individual body 106. Also note that due to the conformal deposition of the non-conductive material layer 118, the corners of the non-conductive features 118 are slightly curved, as discussed with respect to section 111 of FIG. 1A. As illustrated in FIG. 3H, individual non-conductive feature 118 is above and on a corresponding one of the interconnect features 110.

Referring again to FIG. 2, the method 200 proceeds from 220 to 224, where the non-conductive features 118 are removed from a first side of individual bodies 106, without removing the non-conductive features 118 from a second side of individual bodies 106. Thus, while FIG. 3H illustrates the non-conductive features 118 on both left and right sides of individual body 106, in FIG. 3J the non-conductive features 118 are removed from the first side of individual bodies 106. The first side of each body 106 is assumed to be, merely as an example and without limiting the scope of this disclosure, a right side of each body 106.

Figures 3I, 3J, 3K, 3L:
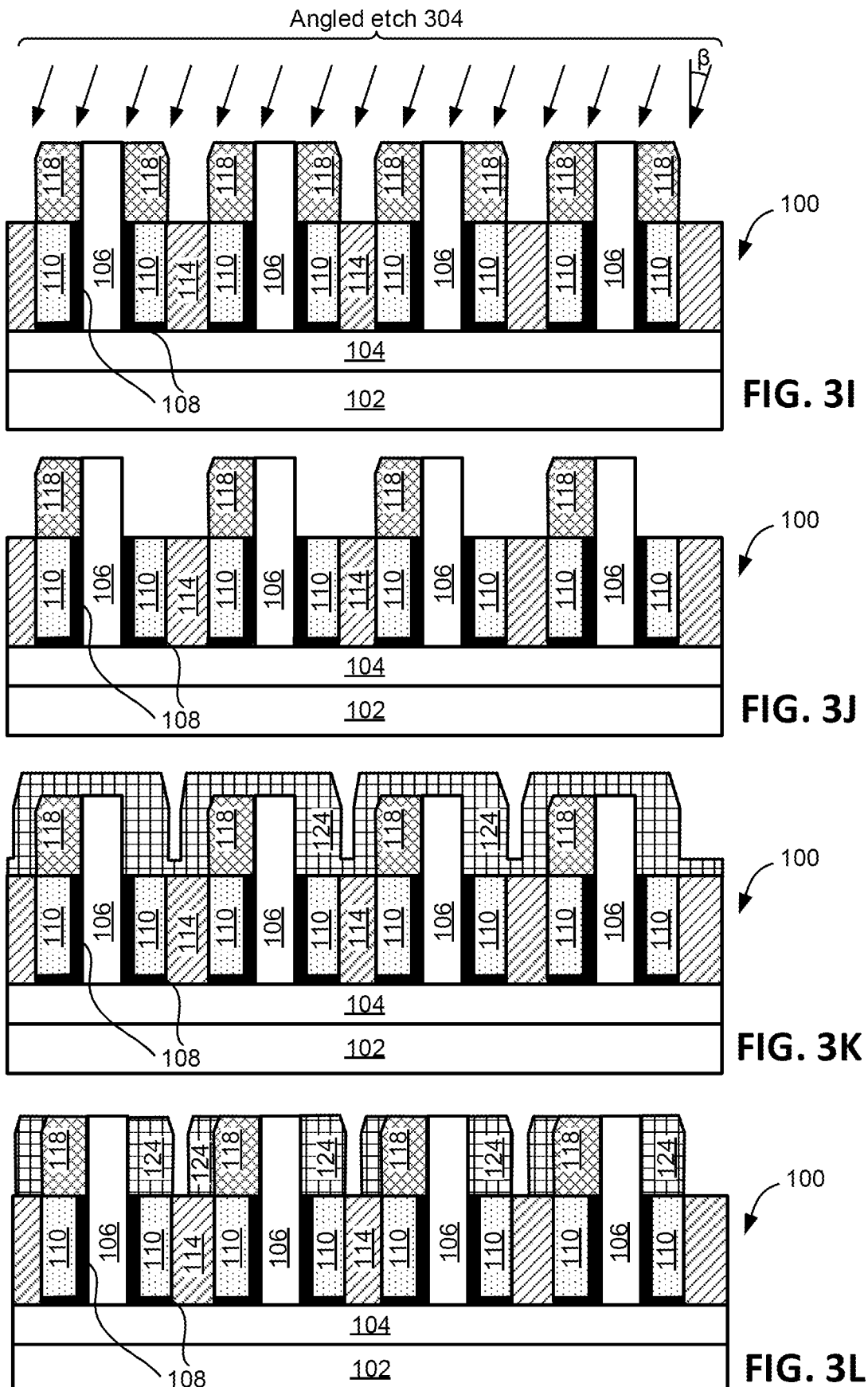

In an example, the removal from the first side is performed using an angled etch process 304, symbolically represented using arrows in FIG. 3I. Angled etch is a hybrid etch process, and is a combination of implant technology and traditional plasma etch tech technology. The angled etch process is also known as lateral reactive ion etch process, or lateral RIE process. A specific hardware is used to implement the angled etch. For example, the wafer (e.g., comprising the IC 100) is on a chuck, and in an example, the chuck may be in a vertical orientation in front of the hardware. The hardware has two chambers: a first plasma chamber where the plasma comprising the reactive ions are generated, and a second process chamber where the plasma comprising the reactive ions interacts with the IC 100. Thus, the wafer with the IC 100 is within the second process chamber. Slits comprising thin openings within the hardware allow the plasma comprising the reactive ions to enter the process chamber from the plasma chamber. Thus, the plasma comprising the reactive ions pass through the slit, to enter the process chamber.

In the angled etch process, the reactive ions hit the IC 100 at an angle $\beta$ (relative to the vertical axis), as illustrated in FIG. 3I. Thus, the arrows in FIG. 3I reflects the angular path of the reactive ions hitting the IC 100. In regular RIE, this angle $\beta$ may be about 0 degrees. But in angled etch, the angle $\beta$ has a substantially non-zero value (e.g., at least 5 degrees), resulting in the reactive ions hitting the IC 100 by a mean or average angle that is substantially different from a right angle (e.g., less than at least 85 degrees, or more than at least 95 degrees). In an example, the angle $\beta$ may be in the range of 5-30 degrees, or in the range of 10-25 degrees, or in the range of 15-20 degrees. This angle is also referred to as Beam Angle Mean (BAM), which is about a mean or average of angles with which the reactive ions hit the wafer.

In an example, the BAM may be controlled by controlling a distance between the wafer surface and the slits, by appropriately controlling the chemistry (e.g., based on refraction and reflection properties of the chemistry) used to generate the reactive ions, and/or by controlling an extraction voltage by which the reactive ions are extracted towards the wafer.

Note that the body 106 and/or the dielectric material 114 are etch selective to the features 118. Accordingly, the angled etch process etches the features 118 on the first side of the bodies 106, without substantially etching the bodies 106 and/or the dielectric material 114. Furthermore, even if some of the dielectric material 114 are etched (e.g., resulting information of dimples within top surfaces of the dielectric material 114), this may not adversely affect the IC 100, as more dielectric material is anyway deposited later in the process (see FIG. 3O) to cover any such dimple. In an example, and although not illustrated, masks may be placed on top of individual bodies 106, to protect the bodies 106 from being etched during the angled etch process 304.

As illustrated in FIG. 3I, the reactive ions hit the IC 100 from the first side (e.g., right side) of the IC 100, and hence, the non-conductive features 118 on the first side of the IC 100 are etched. The bodies 106 have a "shadowing effect" on the features 118 on the second side (e.g., left side) of the bodies. For example, the bodies 106 shadow the features 118 on the second side and prevents the reactive ions from reaching the features 118 on the second side. Accordingly, features 118 on the second side of the bodies are not etched, as illustrated in FIG. 3J. For example, as features 118 on the second side are not in the "line of sight" of the reactive ions, the features 118 on the second side of the bodies 106 are not etched substantially.

Referring again to FIG. 2, the method 200 proceeds from 224 to 228, where non-conductive material layer 124 is conformally deposited on the IC 100, and subsequently horizontal surfaces of the material layer 124 are removed, to thereby form a plurality of non-conductive features 124. FIG. 3K illustrates the non-conductive material layer 124 conformally deposited on the IC 100, and FIG. 3L illustrates the plurality of non-conductive features 124 after removal of the horizontal surfaces of the material layer 124. Process 228 is at least in part similar to the process 220, and hence, is not discussed in further detail.

Referring again to FIG. 2, the method 200 proceeds from 228 to 232, where the non-conductive features 124 are removed from the second side of individual bodies 106, without removing the non-conductive features 124 from the first side of individual bodies 106. Thus, while FIG. 3L illustrates the non-conductive features 124 on both left and right sides of individual body 106, in FIG. 3N the non-conductive features 124 are removed from the second side of individual bodies 106. In an example, the removal is performed using an angled etch process 308, symbolically represented using arrows in FIG. 3M.

Figures 3M, 3N, 3O, 3P:
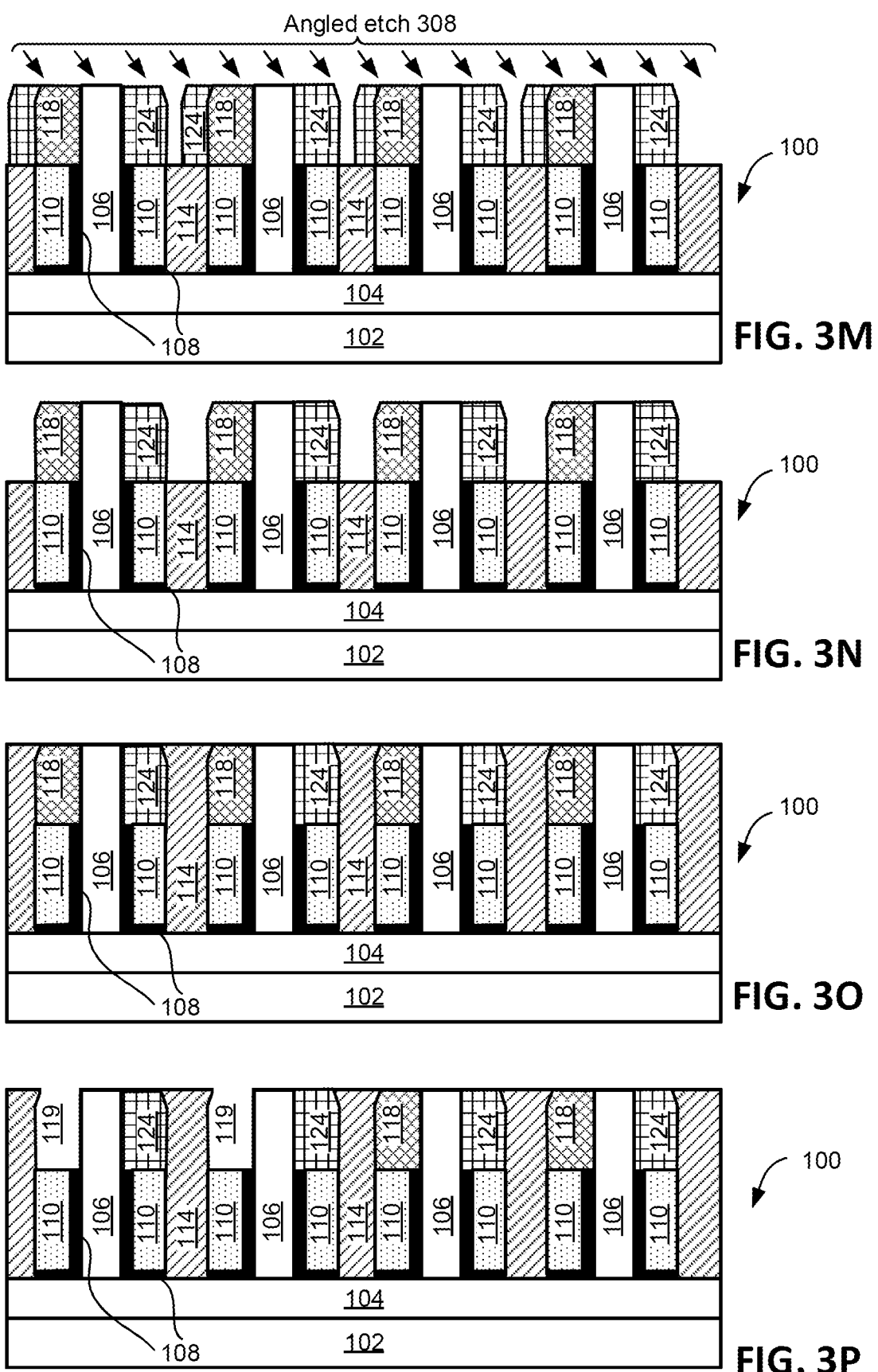

Comparing FIGS. 3I and 3M, in FIG. 3I the reactive ions hit the IC 100 from the first or right side of the IC 100, and in FIG. 3M the reactive ions hit the IC 100 from the second or left side of the IC 100. Thus, a direction or angle of the reactive ions hitting the IC 100 changes between FIG. 3I and FIG. 3M. In one example, it is possible to rotate the previously discussed angled etch hardware, so that the direction or angle of the reactive ions hitting the IC 100 changes. However, in another example, the chuck comprising the wafer (which includes the IC 100) is rotated between the processes discussed with respect to FIG. 3I and FIG. 3M. Because of the rotation of the chuck (e.g., by about 180 degrees) with respect to the hardware projecting the reactive ions in the angular direction defined by angle $\beta$, the direction of the reactive ions changes in FIG. 3M with respect to FIG. 3I.

Referring again to FIG. 2, the method 200 proceeds from 232 to 236, where dielectric material 114 is further deposited, to encapsulate the non-conductive features 118, 124. FIG. 3O illustrates the IC 100 with the dielectric material 114, where a top surface of the dielectric material 114 is coplanar with the top surfaces of the bodies 106 and the non-conductive features 118, 124. For example, the top surface of the dielectric material 114 is polished using an appropriate polishing or planarizing technique, such as chemical mechanical polishing (CMP) or mechanical polishing. This completes formation of the IC 100 of FIG. 1A.

Referring again to FIG. 2, the method 200 proceeds from 236 to 240, where one or more of the non-conductive features 118 are selectively removed. For example, FIG. 3P illustrates selective removal of one or more of the non-conductive features 118, which generates recesses 119 within the IC 100. Note that because the features 118 and 124 are etch selectively, removal of a feature 118 does not substantially etch adjacent features 124. In an example, a first feature 118 is removed by masking other adjacent features 118, 124, and etching the unmasked first feature 118 using an appropriate etching technique, such as an anisotropic etching process.

Figure 3Q:
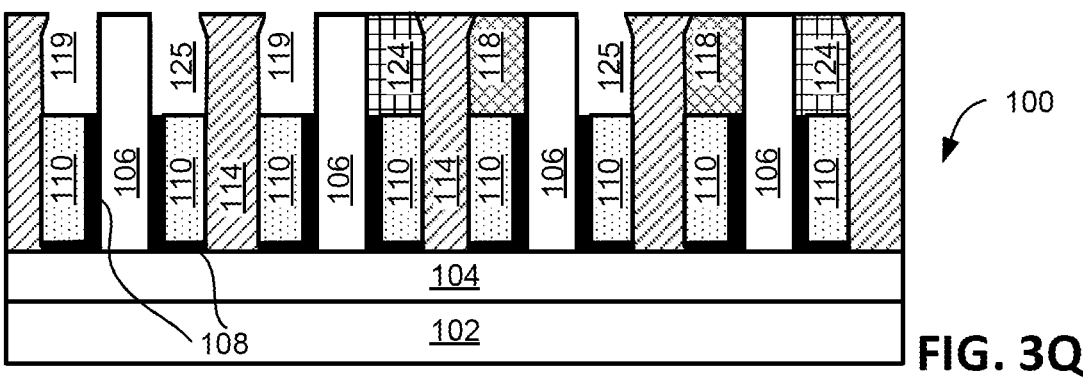

Referring again to FIG. 2, the method 200 proceeds from 240 to 244, where one or more of the non-conductive features 124 are selectively removed. For example, FIG. 3Q illustrates selective removal of one or more of the non-conductive features 124, which generates recesses 125 within the IC 100. Note that because the features 118 and 124 are etch selectively, removal of a feature 124 does not substantially etch adjacent features 118. In an example, a first feature 124 is removed by masking other adjacent features 118, 124, and etching the unmasked first feature 124 using an appropriate etching technique, such as an anisotropic etching process.

Figure 3R:
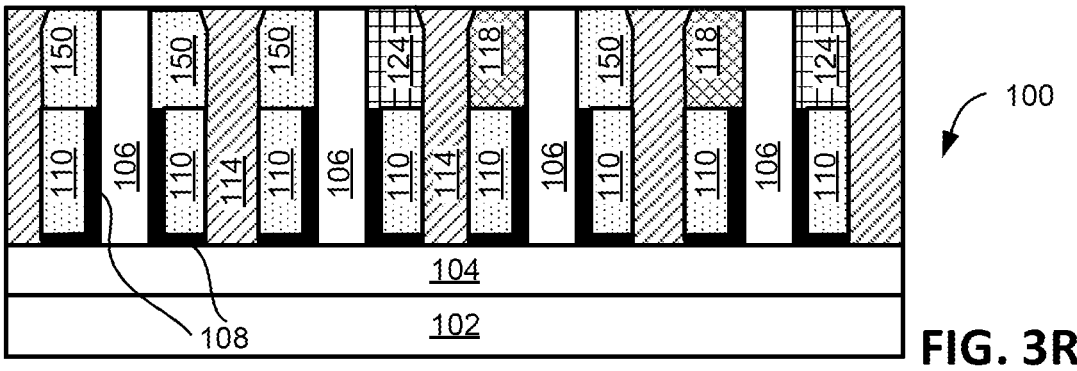
Figure 3S:
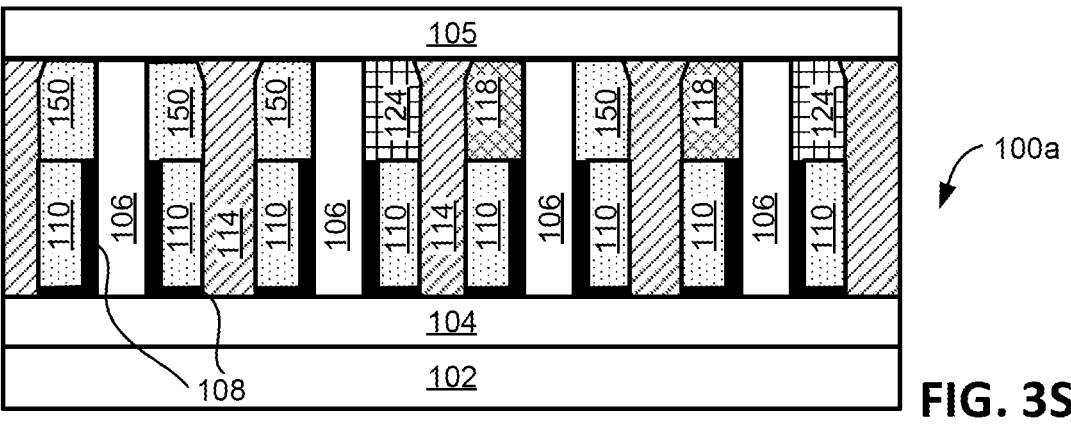

Referring again to FIG. 2, the method 200 proceeds from 244 to 248, where the recesses 119, 125 (which are generated by selectively removal of the features 118, 124) are filled with conductive material, to form the interconnect features 150. FIG. 3R illustrates the recesses 119, 125 (illustrated in FIG. 3Q) filled with conductive material forming the interconnect features 150 above and on some of the interconnect features 110.

Referring again to FIG. 2, the method 200 proceeds from 248 to 252, where the interconnect layer 105 is formed above the interconnect features 150 and non-conductive features 118, 124. FIG. 3S illustrates the interconnect layer 105 above the interconnect features 150 and non-conductive features 118, 124, which results in the IC 100a of FIG. 1B.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Figure 4:
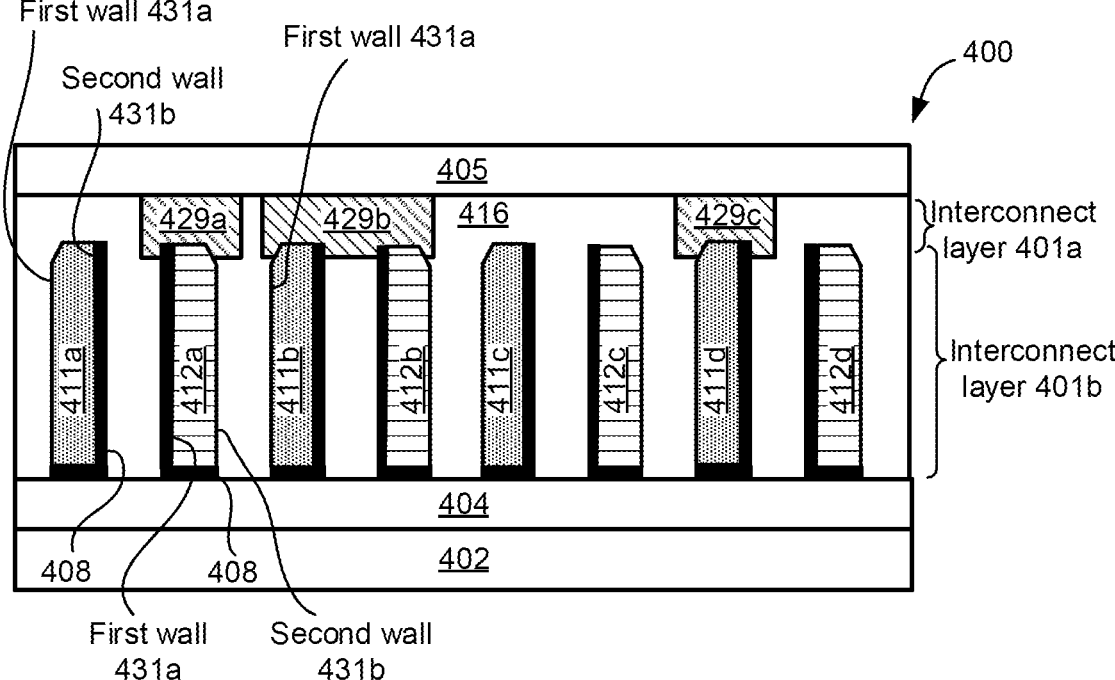
FIG. 4 illustrates a cross-sectional view of a section of an IC including a plurality of conductive first interconnect features comprising a first conductive material interleaved with a plurality of conductive second interconnect features comprising a second conductive material, wherein the first conductive material and the second conductive material are elementally different and have different electrical conductivity, in accordance with an embodiment of the present disclosure.

FIG. 4 illustrates a cross-sectional view of a section of an IC 400 including a plurality of conductive first interconnect features 411 comprising a first conductive material interleaved with a plurality of conductive second interconnect features 412 comprising a second conductive material, wherein the first conductive material and the second conductive material are different and have different electrical conductivity, in accordance with an embodiment of the present disclosure.

In an example, the IC 400 comprises a layer 402, which may be similar to the layer 102 discussed with respect to FIGS. 1A and 1B. A layer 404 is between the layer 402 and the features 411, 412, where the layer 404 may be similar to the layer 104 discussed with respect to FIGS. 1A and 1B.

In one embodiment, the interconnect features 411 and 412 are in pairs, and two interconnect features in a pair are separated by a corresponding section of ILD 416. For example, as illustrated in FIG. 4, interconnect features 411a and 412a form a pair of interconnect features, interconnect features 411b and 412b form a pair of interconnect features, and so on. Although merely 4 pairs, or 8 interconnect features 411, 412 are illustrated, such a number of interconnect features is mere example, and in one implementation, the IC 400 is likely to have many more such interconnect features.

Referring to interconnect features 411, 412, each interconnect feature has a first wall 431a on the left side and a second wall 431b on the right side, as illustrated. For example, the interconnect feature 411a has the second wall 431b facing the first wall of the interconnect feature 412a, as labelled in FIG. 4.

In one embodiment, each of the interconnect features 411 has a conformal liner layer 408 on the second sidewall 431b, where the liner layer is absent on the first sidewall 431a of the interconnect features 411, as illustrated in FIG. 4. In one embodiment, each of the interconnect features 412 has the conformal liner layer 408 on the first sidewall 431a, where the liner layer 408 is absent on the second sidewall 431b of the interconnect features 412, as illustrated in FIG. 4.

In one embodiment, each of the interconnect features 411 and 412 has the liner layer 408 on a bottom surface of the interconnect features, as illustrated in FIG. 4. Example composition and dimensions of the liner layer 408 has been discussed with respect to the liner layer 108 of FIGS. 1A and 1B.

As seen, for each interconnect feature 411, a corner between a first sidewall 431a and a top surface is substantially curved, and a corner between a second sidewall 431b and the top surface is substantially at right angle (e.g., see section 111 of FIG. 1A for further discussion on curved and right-angled corners). On the other hand, for each interconnect feature 412, a corner between a second sidewall 431b and a top surface is substantially curved, and a corner between a first sidewall 431a and the top surface is substantially at right angle. The curved corners are due to conformal deposition of the material of the interconnect features 411, 412, see FIGS. 6C and 6D herein later.

As illustrated, the interconnect feature 411 are interleaved with the interconnect features 412. For example, the interconnect features 411, 412 are alternatively arranged (e.g., arranged in an interleaved manner), such that an interconnect feature 411 is between laterally two interconnect features 412, and similarly, an interconnect feature 412 is laterally between two interconnect features 411, as illustrated in FIG. 4.

In one embodiment, the first interconnect features 411 comprises a first conductive material and the second interconnect features 412 comprises a second conductive material, where the first conductive material and the second conductive material are different and have different electrical conductivity (e.g., different resistivity). For example, a first electrical conductivity (or first resistivity) of the first conductive material is at least 5%, or at least 10%, or at least 15%, or at least 20%, or at least 25% different from a second electrical conductivity (or second resistivity) of the second conductive material. Merely as an example and without limiting the scope of this disclosure, the first conductive material of the interconnect features 411 has relatively higher electrical conductively (e.g., relatively lower resistivity) and the second conductive material of the interconnect features 412 has lower electrical conductively (e.g., relatively higher resistivity).

In an example, the interconnect features 411, 412 comprise conductive material, such as one or more metals, and/or oxide(s) and/or nitride(s) of one or more metals. For example, one of the interconnect features 411, 412 comprises one or more metals, another of the interconnect features 411, 412 comprises an oxide or nitride of metal(s), such that the electrical conductivity of the interconnect features 411 is different from the electrical conductivity of the interconnect features 412. Merely as an example, the first conductive material of the interconnect features 411 may comprise ruthenium (Ru) having relatively higher electrical conductivity and lower resistivity, and the second conductive material of the interconnect features 412 may comprise titanium nitride (TiN) having relatively lower electrical conductivity and higher resistivity. Other combinations of material for the interconnect features 411, 412 may also be possible.

In one embodiment, the interconnect features 411, 412 encapsulated by the ILD 416 form an interconnect layer 401b of the IC 400. An interconnect layer 401a of the IC 400 is above and on the interconnect layer 401b. In an example, the interconnect layer 401a comprises a plurality of conductive vias 429a, where FIG. 4 illustrates example conductive vias 429a, 429b, 429c of the interconnect layer 401a. In one embodiment, another interconnect layer 405 is above the interconnect layer 401a. The interconnect layer 405 comprises one or more conductive interconnect features (such as conductive lines and/or vias).

As illustrated, in the example of FIG. 4, the conductive via 429a is above and on the interconnect feature 412a, the conductive via 429b is above and on the interconnect features 411b and 412b, and the conductive via 429c is above and on the interconnect feature 411d. Thus, the conductive via 429a and the interconnect feature 412a conductively couple a section of the interconnect layer 404 with a corresponding section of the interconnect layer 405. Similarly, the conductive via 429b and the interconnect features 411b, 412b conductively couple another section of the interconnect layer 404 with a corresponding section of the interconnect layer 405. Similarly, the conductive via 429c and the interconnect feature 411d conductively couple yet another section of the interconnect layer 404 with a corresponding section of the interconnect layer 405.

As illustrated, not all of the conductive interconnect features 411, 412 are used to couple the interconnect layers 404, 405. For example, the interconnect features 411a, 411c, 412c are not coupled to the interconnect layers 401a and 405. Accordingly, for example, the interconnect features 411a, 411c, 412c are electrically isolated from the layer 405, and the interconnect features 411a, 411c, 412c may be electrically isolated from other components of the IC 400 or may be electrically floating. The interconnect features 411a, 411c, 412c do not play any functional role in the IC 400.

In one embodiment, one or more of the higher conductive interconnect features 411 may be used to form interconnect between the interconnect layers 404, 405, whereas one or more of the lower conductive interconnect features 412 may be used to form thin film resistors disposed between the interconnect layers 404, 405. For example, the interconnect feature 412a having lower conductivity may form a thin film resistor between the interconnect layers 404, 405, and the interconnect feature 411d having higher conductivity may form an interconnection between the interconnect layers 404, 405.

In an example, the interconnect features 411b, 412b are in parallel and electrically shorted by the conductive via 429b. In an example, the interconnect features 411b, 412b form a low resistance interconnection between the interconnect layers 404, 405. For example, the resistance of the combination of the interconnect features 411b, 412b in parallel is less than a resistance of the interconnect feature 412b alone, and the two interconnect features are coupled in parallel to form a low resistance interconnect.

Thus, the interconnect features 411, 412 are in a single interconnect layer 401b and enable both interconnection feature between the two interconnect layers 404, 405, as well as opportunistically provide thin film resistors.

In an example, the interconnect features 411, 412 are formed with a relatively tight pitch. For example, the interconnect features 411, 412 have a pitch in the range of 5-25 nm. Thus, interconnect features 411, 412 may be formed uniformly (or about uniformly, or non-uniformly), with a high density, between the interconnect layers 404, 405. Only some of the interconnect features 411, 412 are to be used to conductively couple the interconnect layers 404, 405, and perform interconnection function and/or thin film resistor function.

Figures 6A, 6B, 6C, 6D:
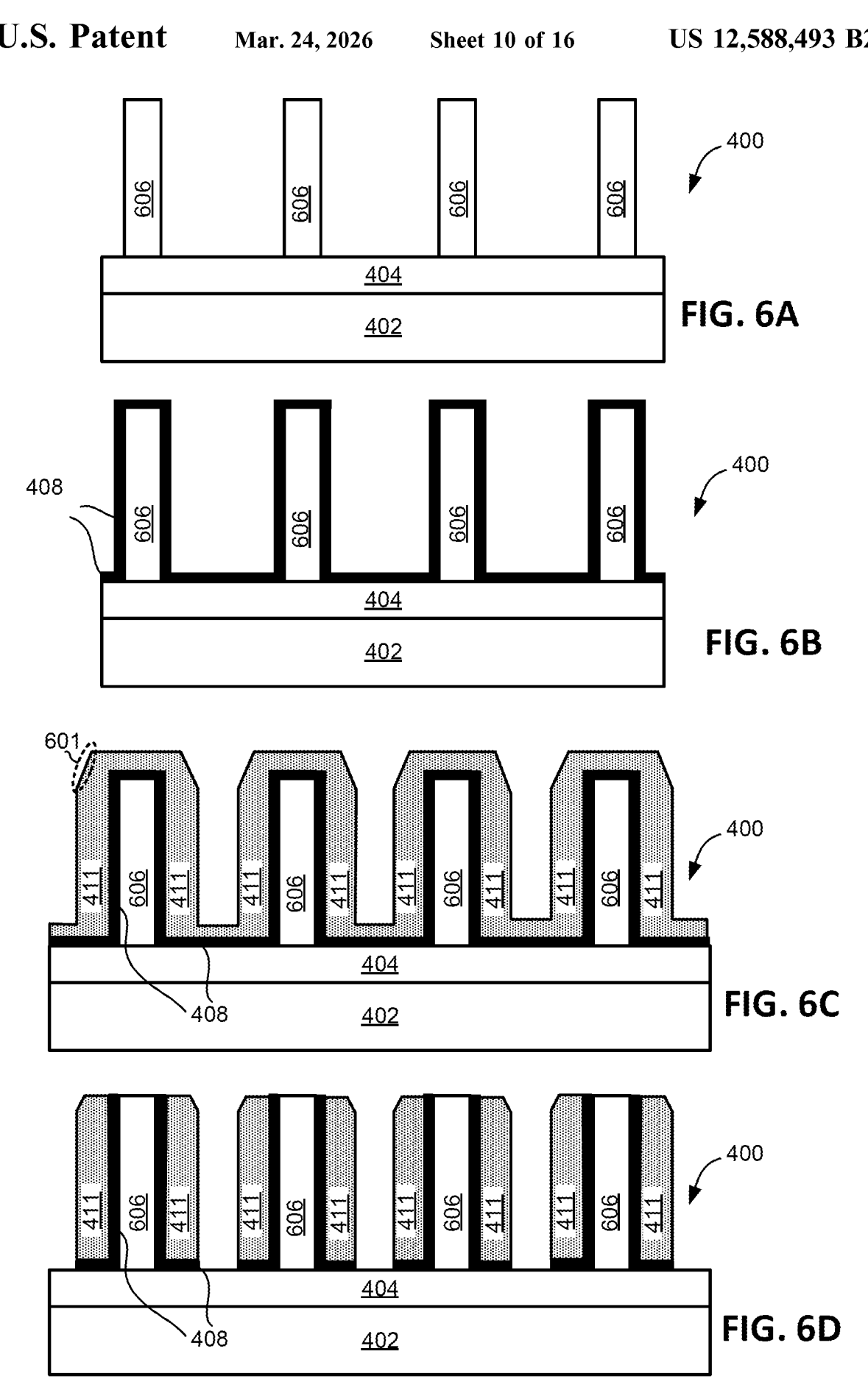

FIG. 5 illustrates a flowchart depicting a method 500 of forming an IC (such as the IC 400 of FIG. 4) comprising a plurality of conductive first interconnect features 411 comprising a first conductive material interleaved with a plurality of conductive second interconnect features 412 comprising a second conductive material, wherein the first conductive material and the second conductive material are different and have different electrical conductivity, in accordance with an embodiment of the present disclosure. FIGS. 6A, 6B, 6C, 6D, 6E, 6F, 6F1, 6G, 6H, 6I, 6J, 6K, 6L, 6M, and 6N illustrate cross-sectional views of an IC (such as the IC 400 of FIG. 4) in various stages of processing, in accordance with an embodiment of the present disclosure. FIGS. 5 and 6A-6N will be discussed in unison.

Referring to FIG. 5, the method 500 includes, at 504, forming a plurality of bodies 606 on an interconnect layer 404. FIG. 6A illustrates the bodies 606 on the interconnect layer 404. In an example, the bodies 606 comprise sacrificial material that would be later removed. In an example, the bodies 606 may be formed using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example.

Referring again to FIG. 5, the method 500 then proceeds from 504 to 508, where conformal liner layer 408 is deposited on the interconnect layer 404 and the bodies 606, followed by deposition of conformal conductive material layer 411 on the interconnect layer 404 and the bodies 606. For example, FIGS. 6B and 6C illustrate deposition of the conformal liner layer 408 and the conductive material 411 on the interconnect layer 404 and the bodies 606, as also discussed in further detail with respect to process 208 of method 200 of FIG. 2. As previously discussed herein, the conductive material 411 has relatively high conductively and relatively low resistivity (e.g., compared to the conductive material of the interconnect features 412). Merely as an example, the conductive material 411 may comprise ruthenium having relatively higher conductivity and low resistivity. In an example, the conductive material layer 411 may be deposited using an electroless process, CVD, PVD, ALD, VPE, MBE, or LPE, for example. As also discussed with respect to the process 208 of the method 20 of FIG. 2, in the process 508 of the method 500, due to the conformal deposition of the conductive material 411, the conductive material 411 have corners that are curved, e.g., not perpendicular with the sidewalls. Such a curved corner is illustrated within the dotted oval shape 601 in FIG. 6C.

Referring again to FIG. 5, the method 500 proceeds from 508 to 512, where horizontal sections of the conductive material layer 411 are removed, such that the conductive material layer 411 are on sidewalls of the bodies 606. FIG. 6D illustrates removal of the horizontal sections of the conductive material layer 411. The process 508 of the method 500 of FIG. 5 is at least in part similar to the process 208 of the method 200 of FIG. 2.

Referring again to FIG. 5, the method 500 proceeds from 512 to 516, where the interconnect features 411 are removed from a first side of individual bodies 606, without removing the interconnect features 411 from a second side of individual bodies 606, e.g., using an angled etch process. FIG.

6E symbolically illustrates a direction of the reactive ions in the angled etch process 604, and FIG. 6F illustrates the interconnect features 411 removed from right sides of individual bodies and remaining on left sides of individual bodies. The angled etch process has been discussed in further detail with respect to method 200 of FIG. 2 and FIGS. 3I and 3M herein previously.

Figure 6G:
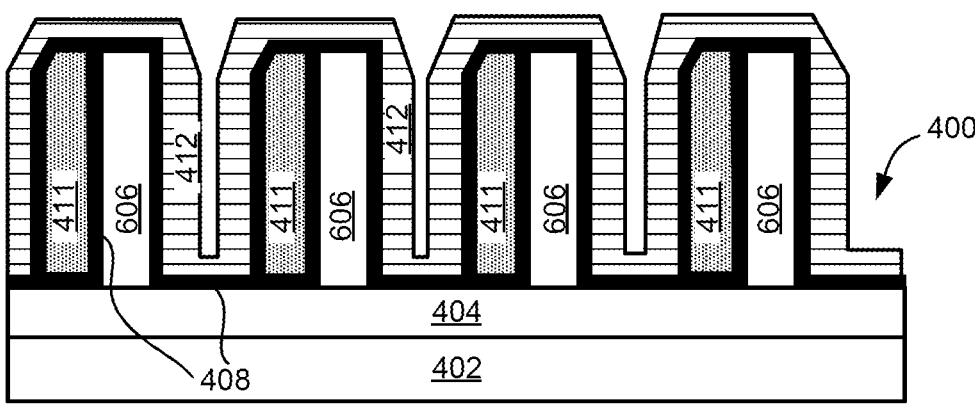

Referring again to FIG. 5, the method 500 proceeds from 516 to 520, where conductive material 412 is conformally deposited on the interconnect layer 404, the bodies 606, and the interconnect features 411, as illustrated in FIG. 6G. Note that prior to the conformal deposition of the conductive material 412, liner layer 408 may be conformally deposited, as illustrated in FIG. 6F1. As previously discussed herein, the conductive material 412 has relatively low conductively and relatively high resistivity (e.g., compared to the conductive material of the interconnect features 411). Merely as an example, the conductive material 412 may comprise titanium nitride (or another appropriate metal oxide or metal nitride) having relatively lower conductivity and higher resistivity. In an example, the conductive material layer 412 may be deposited using an electroless process, CVD, PVD, ALD, VPE, MBE, or LPE, for example. As also discussed with respect to the process 208 of the method 20 of FIG. 2, in the process 520 of the method 500, due to the conformal deposition of the conductive material 412, the conductive material 412 have corners that are curved, e.g., not perpendicular with the sidewalls.

Figure 6H:
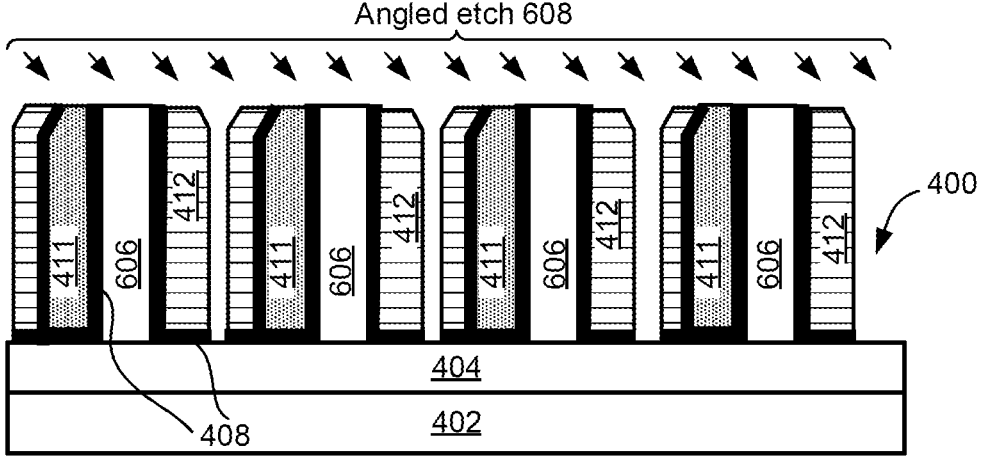

Referring again to FIG. 5, the method 500 proceeds from 520 to 524, where horizontal sections of the conductive material layer 412 are removed, such that the conductive material layer 412 are on sidewalls of the bodies 606 and interconnect features 411, to form the plurality of interconnect features 412, as also illustrated in FIG. 6H. The process 524 of the method 500 of FIG. 5 is at least in part similar to the process 208 of the method 200 of FIG. 2.

Figure 6I:
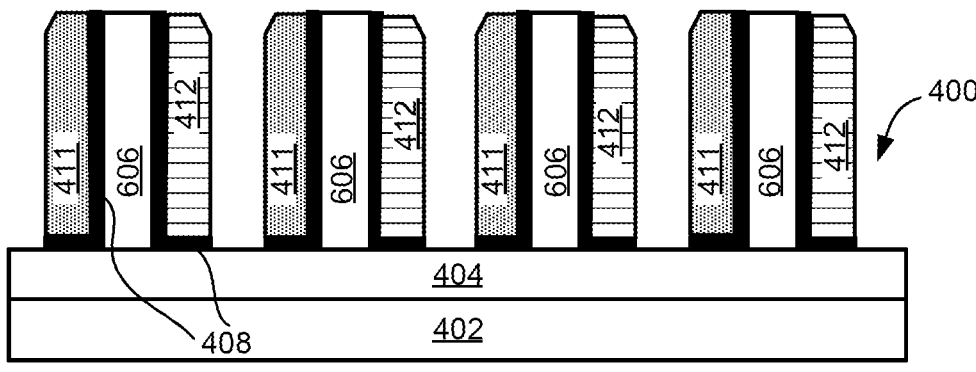

Referring again to FIG. 5, the method 500 proceeds from 524 to 528, where the interconnect features 412 are removed from the second side of individual bodies 606, without removing the interconnect features 411 from the first side of individual bodies 606, e.g., using an angled etch process. FIG. 6H symbolically illustrates a direction of the reactive ions in the angled etch process 608, and FIG. 6I illustrates the interconnect features 412 removed from left sides of individual bodies 606 and remaining on right sides of individual bodies 606. The angled etch process has been discussed in further detail with respect to method 200 of FIG. 2 and FIGS. 3I and 3M herein previously.

Figure 6J:
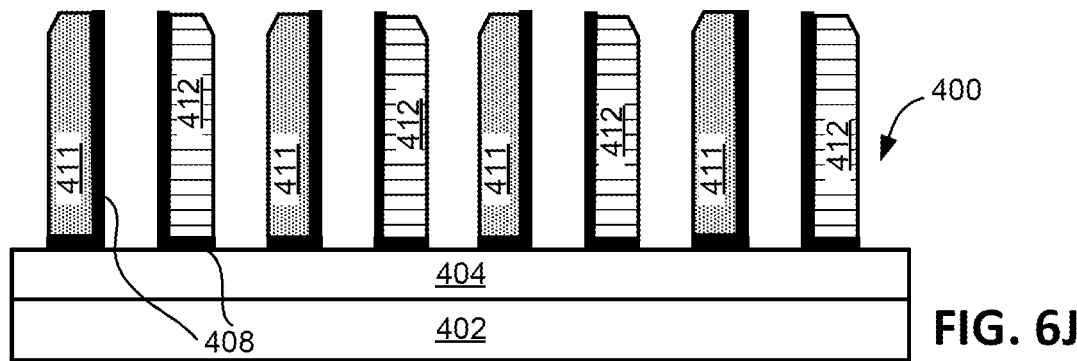

Referring again to FIG. 5, the method 500 proceeds from 528 to 532, where the plurality of sacrificial bodies 106 are removed, e.g., etched away, as illustrated in FIG. 6J. An appropriate etching technique may be used, such as an isotropic etching process. In another example, the bodies 606 may not be removed, and instead remain in the IC 400.

Figure 6K:
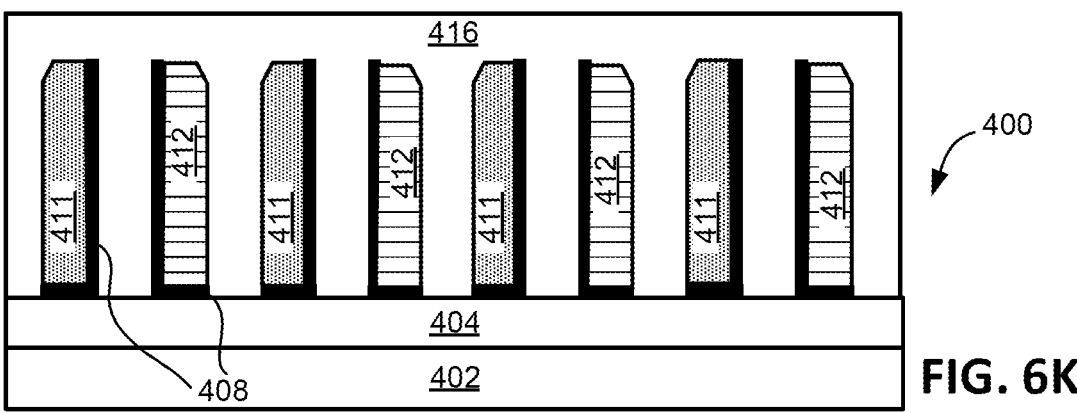
Figure 6L:
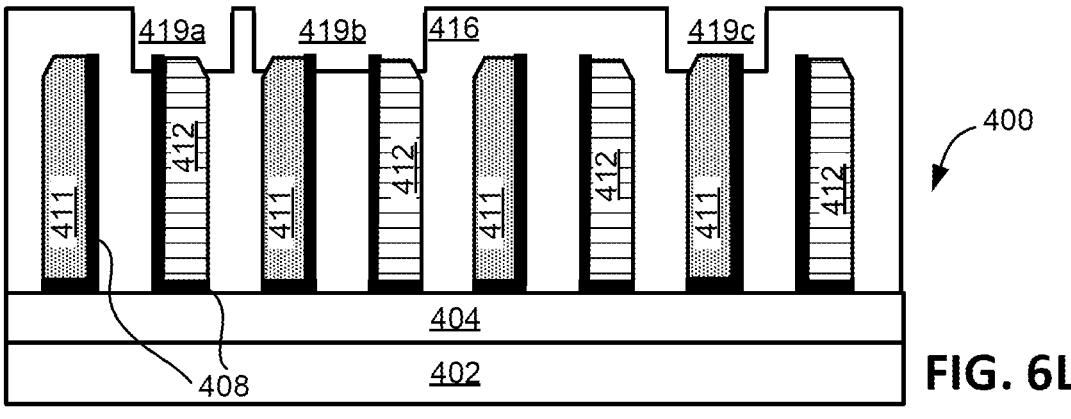

Referring again to FIG. 5, the method 500 proceeds from 532 to 536, where ILD 416 is deposited over the interconnect features 411, 412, as illustrated in FIG. 6K. Referring again to FIG. 5, the method 500 proceeds from 536 to 540, where the ILD 416 is patterned, to form recesses 419 for conductive vias 429, as illustrated in FIG. 6L.

Figure 6M:
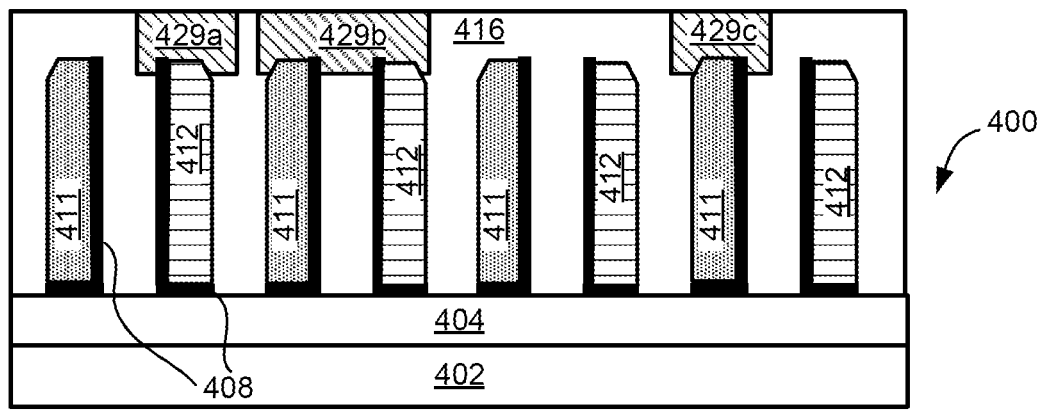
Figure 6N:
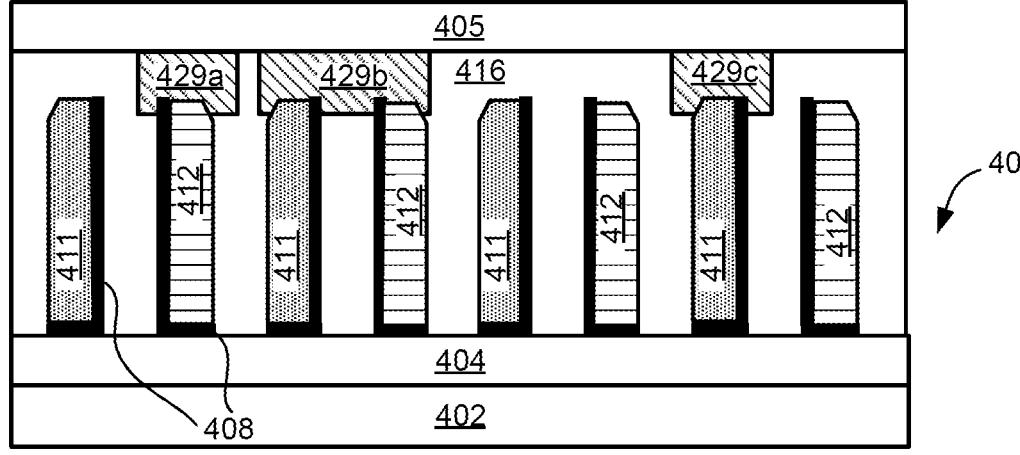

Referring again to FIG. 5, the method 500 proceeds from 540 to 544, where the conductive vias 429 are formed within the recesses 419, as also illustrated in FIG. 6M. For example, the conductive vias 429 may comprise one or more of copper, ruthenium, molybdenum, tin, indium, antimony, aluminum, or bismuth. In an example, the conductive vias 429 may be formed using an electroplating process, to deposit copper (or another metal) within the recesses 419. In another example, another deposition technique may be used, such as CVD, PVD, ALD, VPE, MBE, or LPE, for example. As discussed herein previously, in the example of FIG. 4, the conductive via 429a is above and on the interconnect feature 412a, the conductive via 429b is above and on the interconnect features 411b and 412b, and the conductive via 429c is above and on the interconnect feature 411d.

Referring again to FIG. 5, the method 500 proceeds from 544 to 548, where the interconnect layer 405 is formed above and on the dielectric material or ILD layer 416, as illustrated in FIG. 6N, and as also illustrated in FIG. 4.

Note that the processes in method 500 are shown in a particular order for ease of description. However, one or more of the processes may be performed in a different order or may not be performed at all (and thus be optional), in accordance with some embodiments. Numerous variations on method 500 and the techniques described herein will be apparent in light of this disclosure.

FIGS. 7A1, 7A2, 7B, 7C1, and 7C2 illustrate cross-sectional views of an IC in various stages of processing, where processing of the IC includes using an angled etch process, in accordance with an embodiment of the present disclosure. For example, the processing results in either of IC 700a of FIG. 7C1 or IC 700b of FIG. 7C2.

The processing commences with the IC 700 of FIG. 7A1, where feature 710a is on a side of a body 706a, and where feature 710b is on a side of another body 706b. The bodies 706a, 706b comprises non-conductive material, such as an insulator, a dielectric, or a semiconductor material, e.g., depending on an application for which the IC is to be eventually used. The features 710a, 710b may be conductive interconnect features, or can be non-conductive features, e.g., again depending on an application for which the IC is to be eventually used. The features 710 and the bodies 706 are formed on a layer 704, which may be similar to the layer 104 of FIGS. 1A and 1B.

In the example of FIG. 7A1, a hard mask 722a is on the body 706a, and a hard mask 722b is on the body 706b. In contrast, in the example of FIG. 7A2, the hard mask 722a is on the body 706a and also partially covers the feature 710a, and the hard mask 722b is on the body 706b and also partially covers the feature 710a.

Referring now to FIG. 7B, an angled etch process 723 is performed on the IC 700, where reactive ions are directed at an angle (e.g., which is substantially different from a right angle) towards the IC 700 (see previous discussion herein for further detail of the angled etch process), where example directions of the reactive ions are illustrated using arrows in FIG. 7B. The hard mask 722a and the body 706a substantially shadows the body 710a from the reactive ions, and hence, the body 710a is not substantially etched by the angled etch process 723.

In an example, the angled etch process 723 substantially etches a top portion of the body 710b, as illustrated in FIG. 7C1. In another example, the angled etch process 723 substantially etches an entirety of the body 710b, as illustrated in FIG. 7C2.

Whether the angled etch process 723 substantially etches only the top portion of the body 710b or the entire body 710b may depend on several factors, such as an angle at which the reactive ions are directed towards the IC 700, and an aspect ratio of the cavity between the two features 710a, 710b. For example, the aspect ratio is a ratio of a height h and width w illustrated in FIG. 7B. When the aspect ratio is lower, the angled etch process 723 will reach near the bottom of the body 710b (e.g., compared to a higher aspect ratio), and if the aspect ratio is sufficiently low, the entire feature 710*b* may be etched, as illustrated in FIG. 7C2. In contrast, if the aspect ratio is relatively high, only the top portions of the feature 710*b* will be etched, as illustrated in FIG. 7C1.

Example System

Figure 8:
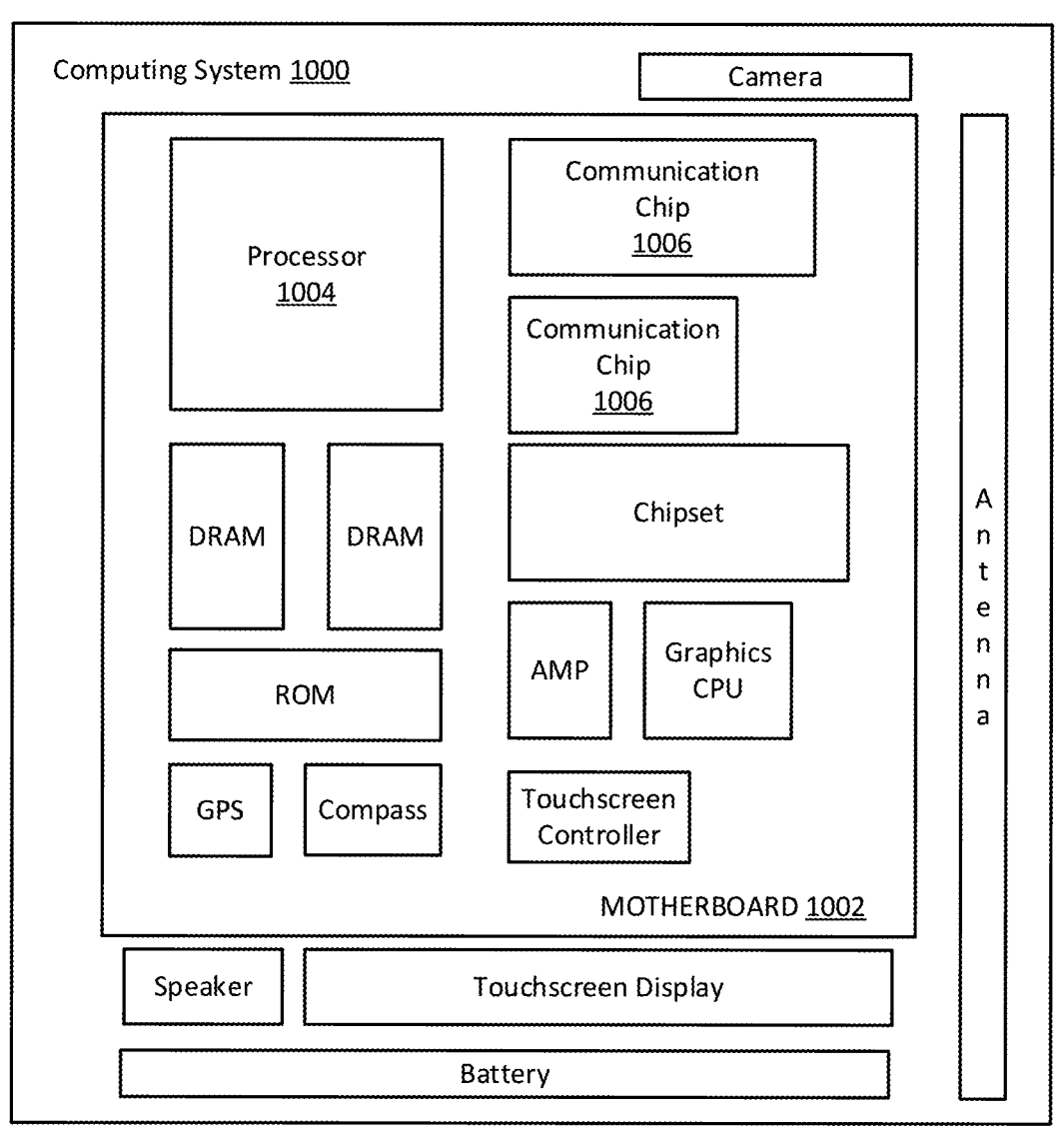
FIG. 8 illustrates a computing system implemented with integrated circuit structures having one or more interconnect features formed using the techniques disclosed herein, in accordance with some embodiments of the present disclosure.

FIG. 8 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit comprising: a first interconnect layer; a conductive first interconnect feature and a conductive second interconnect feature laterally separated by a body of non-conductive material, wherein the first and second interconnect features are above the first interconnect layer; a non-conductive feature above and on the first interconnect feature, and a conductive third interconnect feature above and on the second interconnect feature; and a second interconnect layer above the non-conductive feature and third interconnect features, wherein the second and third interconnect features conductively couple the first and second interconnect layers.

Example 2. The integrated circuit of example 1, wherein: the non-conductive feature has (i) a first sidewall facing the body, and (ii) an opposite second sidewall; a first corner between the second sidewall of the non-conductive feature and a top surface of the non-conductive feature is substantially curved, such that the second sidewall of the non-conductive feature is not substantially perpendicular to the top surface of the non-conductive feature; and a second corner between the first sidewall of the non-conductive feature and the top surface of the non-conductive feature is substantially at a right angle.

Example 3. The integrated circuit of any of examples 1-2, wherein: the third interconnect feature has (i) a first sidewall facing the body, and (ii) an opposite second sidewall; a first corner between the second sidewall of the third interconnect feature and a top surface of the third interconnect feature is substantially curved; and a second corner between the first sidewall of the third interconnect feature and the top surface of the third interconnect feature is substantially at a right angle.

Example 4. The integrated circuit of any of examples 1-3, wherein the first interconnect feature has a first sidewall opposite a second sidewall, and wherein the integrated circuit further comprises: a conformal layer between (i) the first sidewall of the first interconnect feature and (ii) the body, wherein the conformal layer is on the first sidewall of the first interconnect feature and not on the second sidewall of the first interconnect feature.

Example 5. The integrated circuit of any of examples 1-4, wherein the second interconnect feature has a first sidewall opposite a second sidewall, and wherein the integrated circuit further comprises: a conformal layer between (i) the first sidewall of the second interconnect feature and (ii) the body, wherein the conformal layer is on the first sidewall of the second interconnect feature and not on the second sidewall of the second interconnect feature.

Example 6. The integrated circuit of any of examples 1-5, wherein the body is a first body, the non-conductive feature is a first non-conductive feature, and wherein the integrated circuit further comprises: a conductive fourth interconnect feature and a conductive fifth interconnect feature laterally separated by a second body of non-conductive material, wherein the fourth and the fifth interconnect features are above the first interconnect layer, and wherein the first body and the second body are laterally separated by at most 150 nanometers; and a second non-conductive feature above and on the fourth interconnect feature, and a third non-conductive feature above and on the fifth interconnect feature.

Example 7. The integrated circuit of example 6, wherein the first and second non-conductive features comprise a first non-conductive material, and wherein the third non-conductive feature comprises a second non-conductive material.

Example 8. The integrated circuit of example 6, wherein the first and second non-conductive features comprise a first non-conductive material, and wherein the third non-conductive feature comprises a second non-conductive material that is different from the first non-conductive material.

Example 9. The integrated circuit of example 8, wherein the second non-conductive material is etch selective relative to the first non-conductive material.

Example 10. The integrated circuit of any of examples 8-9, wherein: each of the first body and the second body has (i) a first side facing a first direction, and (ii) a second side facing a second direction that is opposite the first direction; the first non-conductive feature is on the first side of the first body; the second non-conductive feature is on the first side of the second body; and the third non-conductive feature is on the second side of the first body.

Example 11. The integrated circuit of any of examples 6-10, wherein: the second non-conductive feature is laterally between the first non-conductive feature and the third non-conductive feature.

Example 12. The integrated circuit of any of examples 1-11, wherein conductive material of the third interconnect feature and conductive material of the second interconnect feature have a seam formed therebetween.

Example 13. The integrated circuit of any of examples 1-12, wherein the first interconnect feature is electrically isolated from one or both the first interconnect layer and the second interconnect layer.

Example 14. The integrated circuit of any of examples 1-13, wherein the first interconnect feature is configured to not transmit any signal or power.

Example 15. The integrated circuit of any of examples 1-14, wherein the first interconnect feature is electrically floating.

Example 16. The integrated circuit of any of examples 1-15, wherein the first interconnect feature, the second interconnect feature, and the third interconnect feature comprise one or more of ruthenium, molybdenum, tin, indium, antimony, aluminum, or bismuth.

Example 17. An integrated circuit comprising: a first interconnect layer; a plurality of conductive first interconnect features interleaved with a plurality of conductive second interconnect features, wherein the plurality of conductive first interconnect features comprises first conductive material, and wherein the plurality of conductive second interconnect features comprises second conductive material; and a second interconnect layer above the plurality of conductive first interconnect features and the plurality of conductive second interconnect features.

Example 18. The integrated circuit of example 17, wherein the first conductive material is different from the second conductive material.

Example 19. The integrated circuit of any of examples 17-18, wherein the first conductive material has a first electrical conductivity that is different from a second electrical conductivity of the second conductive material.

Example 20. The integrated circuit of any of examples 17-19, wherein the first conductive material has a first electrical conductivity that is at least 10% different from a second electrical conductivity of the second conductive material.

Example 21. The integrated circuit of any of examples 17-20, wherein one of the first or second conductive material comprises a metal, and the other of the first or second conductive material comprises a metal and at least one of oxygen or nitrogen.

Example 22. The integrated circuit of any of examples 17-21, wherein the first conductive material comprises ruthenium, and wherein the second conductive material comprises titanium and nitrogen.

Example 23. The integrated circuit of any of examples 17-22, wherein: the first conductive material has a first electrical conductivity that is at least 10% less than a second electrical conductivity of the second conductive material; one or more of the plurality of conductive first interconnect features are thin film resistors between the first and second interconnect layers; and one or more of the plurality of conductive second interconnect features interconnect are interconnects between the first and second interconnect layers.

Example 24. The integrated circuit of any of examples 17-23, wherein: first one or more of the plurality of conductive first interconnect features conductively couple the first and second interconnect layers; and second one or more of the plurality of conductive first interconnect features do not conductively couple the first and second interconnect layers, and are electrically isolated from one or both the first and second interconnect layers.

Example 25. The integrated circuit of any of examples 16-23, wherein: first one or more of the plurality of conductive first interconnect features conductively couple the first and second interconnect layers; and second one or more of the plurality of conductive first interconnect features do not conductively couple the first and second interconnect layers.

Example 26. The integrated circuit of example 25, further comprising: a conductive via conductively coupling one of the second one or more of the plurality of conductive first interconnect features to the second interconnect layer.

Example 27. The integrated circuit of any of examples 17-26, wherein: first one or more of the plurality of conductive second interconnect features conductively couple the first and second interconnect layers; and second one or more of the plurality of conductive second interconnect features do not conductively couple the first and second interconnect layers.

Example 28. The integrated circuit of any of examples 17-27, wherein: individual ones of the plurality of conductive first and second interconnect features comprise a first sidewall, an opposite second sidewall, and a top surface; a first corner between the first sidewall of an interconnect feature and a top surface of the interconnect feature is curved, such that the first sidewall of the interconnect feature is not substantially perpendicular to the top surface of the interconnect feature; and a second corner between the second sidewall of the interconnect feature and the top surface of the interconnect feature is substantially at a right angle.

Example 29. The integrated circuit of any of examples 17-28, wherein: the plurality of conductive first interconnect features comprise a first interconnect feature, and the plurality of conductive second interconnect features comprise a second interconnect feature, wherein the first and second interconnect features are adjacent interconnect features, without any intervening interconnect feature laterally between the first and second interconnect features; each of the first interconnect feature and the second interconnect feature has a first sidewall, a second sidewall, and a top surface, such that the second sidewall of the first interconnect feature faces the first sidewall of the second interconnect feature; a corner between the second sidewall of the first interconnect feature and the top surface of the first interconnect feature is substantially at a right angle; a corner between the first sidewall of the first interconnect feature and the top surface of the first interconnect feature is substantially curved; a corner between the first sidewall of the second interconnect feature and the top surface of the second interconnect feature is substantially at a right angle; and a corner between the second sidewall of the second interconnect feature and the top surface of the second interconnect feature is substantially curved.

Example 30. The integrated circuit of example 29, wherein: the plurality of conductive first interconnect features further comprise a third interconnect feature, wherein the second and third interconnect features are adjacent interconnect features, without any intervening interconnect feature laterally between the second and third interconnect features, and wherein the second interconnect feature is laterally between the first and third interconnect features; the third interconnect feature has a first sidewall, a second sidewall, and a top surface, such that the second sidewall of the second interconnect feature faces the first sidewall of the third interconnect feature; a corner between the second sidewall of the third interconnect feature and the top surface of the third interconnect feature is substantially at a right angle; and a corner between the first sidewall of the third interconnect feature and the top surface of the third interconnect feature is substantially curved.

Example 31. A method of forming an integrated circuit, comprising: forming (i) a first conductive interconnect feature on a first side of a bottom section of a body, and (ii) a second conductive interconnect feature on a second side of the bottom section of the body, the body comprising non-conductive material; forming (i) a first non-conductive feature on the first side of a top section of the body, and (ii) a second non-conductive feature on the second side of the top section of the body, wherein the first non-conductive feature is on and above the first conductive interconnect feature, and wherein the second non-conductive feature is on and above the second conductive interconnect feature; and removing the second non-conductive feature, without removing the first non-conductive feature, the first conductive interconnect feature, and the second conductive interconnect feature.

Example 32. The method of example 31, wherein removing the second non-conductive feature comprises: directing reactive ions at an angle towards the first non-conductive feature, the second non-conductive feature, and the body, wherein the reactive ions facilitate etching of the second non-conductive feature, and wherein the body shadows the first non-conductive feature from the reactive ions and prevents substantial etching of the first non-conductive feature.

Example 33. The method of any of examples 31-32, further comprising: forming (i) a third non-conductive feature on the first non-conductive feature that is on the first side of the top section of the body, and (ii) and a fourth non-conductive feature on the second side of the top section of the body, wherein the fourth non-conductive feature is on and above the second conductive interconnect feature; and removing the third non-conductive feature, without removing the first non-conductive feature, the fourth non-conductive feature, the first conductive interconnect feature, and the second conductive interconnect feature.

Example 34. The method of example 33, wherein removing the third non-conductive feature comprises: directing reactive ions at an angle towards the third non-conductive feature, the fourth non-conductive feature, and the body, wherein the reactive ions facilitate etching of the third non-conductive feature, and wherein the body shadows the fourth non-conductive feature from the reactive ions and prevents substantial etching of the fourth non-conductive feature.

Example 35. The method of any of examples 33-24, wherein: the first and second non-conductive features comprise first non-conductive material; and the third and fourth non-conductive features comprise second non-conductive material different from the first non-conductive material.

Example 36. The method of any of examples 33-35, wherein: the first and second non-conductive features comprise first non-conductive material; and the third and fourth non-conductive features comprise second non-conductive material different from, and etch selective relative to, the first non-conductive material.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:

a first interconnect layer;

a conductive first interconnect feature and a conductive second interconnect feature laterally separated by a body of non-conductive material having a first dielectric material, wherein the first and second conductive interconnect features are above the first interconnect layer;

a non-conductive feature having a second dielectric material with a different material composition compared to the first dielectric material, the non-conductive feature being above and directly on the conductive first interconnect feature, and a conductive third interconnect feature above and on the conductive second interconnect feature; and a second interconnect layer above the non-conductive feature and conductive third interconnect features, wherein the conductive second and third interconnect features conductively couple the first and second interconnect layers.

2. The integrated circuit of claim 1, wherein:

the non-conductive feature has (i) a first sidewall facing the body, and (ii) an opposite second sidewall;

a first corner between the second sidewall of the non-conductive feature and a top surface of the non-conductive feature is substantially curved, such that the second sidewall of the non-conductive feature is not substantially perpendicular to the top surface of the non-conductive feature; and a second corner between the first sidewall of the non-conductive feature and the top surface of the non-conductive feature is substantially at a right angle.

3. The integrated circuit of claim 1, wherein:

the conductive third interconnect feature has (i) a first sidewall facing the body, and (ii) an opposite second sidewall;

a first corner between the second sidewall of the conductive third interconnect feature and a top surface of the conductive third interconnect feature is substantially curved; and a second corner between the first sidewall of the conductive third interconnect feature and the top surface of the conductive third interconnect feature is substantially at a right angle.

4. The integrated circuit of claim 1, wherein the conductive first interconnect feature has a first sidewall opposite a second sidewall, and wherein the integrated circuit further comprises:

a conformal layer between (i) the first sidewall of the conductive first interconnect feature and (ii) the body, wherein the conformal layer is on the first sidewall of the conductive first interconnect feature and not on the second sidewall of the conductive first interconnect feature.

5. The integrated circuit of claim 1, wherein the conductive second interconnect feature has a first sidewall opposite a second sidewall, and wherein the integrated circuit further comprises:

a conformal layer between (i) the first sidewall of the conductive second interconnect feature and (ii) the body, wherein the conformal layer is on the first sidewall of the conductive second interconnect feature and not on the second sidewall of the conductive second interconnect feature.

6. The integrated circuit of claim 1, wherein the body is a first body, the non-conductive feature is a first non-conductive feature, and wherein the integrated circuit further comprises:

a conductive fourth interconnect feature and a conductive fifth interconnect feature laterally separated by a second body of non-conductive material, wherein the conductive fourth and the conductive fifth interconnect features are above the first interconnect layer, and wherein the first body and the second body are laterally separated by at most 150 nanometers; and a second non-conductive feature above and on the fourth interconnect feature, and a third non-conductive feature above and on the fifth interconnect feature.

7. The integrated circuit of claim 6, wherein the first and second non-conductive features comprise a first non-conductive material, and wherein the third non-conductive feature comprises a second non-conductive material that is different from the first non-conductive material.

8. The integrated circuit of claim 7, wherein the second non-conductive material is etch selective relative to the first non-conductive material.

9. The integrated circuit of claim 7, wherein:

each of the first body and the second body has (i) a first side facing a first direction, and (ii) a second side facing a second direction that is opposite the first direction;

the first non-conductive feature is on the first side of the first body;

the second non-conductive feature is on the first side of the second body; and the third non-conductive feature is on the second side of the first body.

10. The integrated circuit of claim 1, wherein conductive material of the conductive third interconnect feature and conductive material of the conductive second interconnect feature have a seam formed therebetween.

11. The integrated circuit of claim 1, wherein the conductive first interconnect feature is electrically isolated from one or both the first interconnect layer and the second interconnect layer.

12. An integrated circuit comprising:

a first interconnect layer;

a plurality of conductive first interconnect features interleaved with and spaced apart from a plurality of conductive second interconnect features, wherein the plurality of conductive first interconnect features comprises first conductive material, and wherein the plurality of conductive second interconnect features comprises second conductive material having a different material composition compared to the first conductive material; and a second interconnect layer above the plurality of conductive first interconnect features and the plurality of conductive second interconnect features.

13. The integrated circuit of claim 12, wherein the first conductive material has a first electrical conductivity that is at least 10% different from a second electrical conductivity of the second conductive material.

14. The integrated circuit of claim 12, wherein one of the first or second conductive material comprises a metal, and the other of the first or second conductive material comprises a metal and at least one of oxygen or nitrogen.

15. The integrated circuit of claim 12, wherein:

the first conductive material has a first electrical conductivity that is at least 10% less than a second electrical conductivity of the second conductive material;

one or more of the plurality of conductive first interconnect features are thin film resistors between the first and second interconnect layers; and one or more of the plurality of conductive second interconnect features interconnect are interconnects between the first and second interconnect layers.

16. The integrated circuit of claim 12, wherein:

first one or more of the plurality of conductive first interconnect features conductively couple the first and second interconnect layers; and second one or more of the plurality of conductive first interconnect features do not conductively couple the first and second interconnect layers, and are electrically isolated from one or both the first and second interconnect layers.

17. The integrated circuit of claim 12, wherein:

individual ones of the plurality of conductive first and second interconnect features comprise a first sidewall, an opposite second sidewall, and a top surface;

a first corner between the first sidewall of an interconnect feature and a top surface of the interconnect feature is curved, such that the first sidewall of the interconnect feature is not substantially perpendicular to the top surface of the interconnect feature; and a second corner between the second sidewall of the interconnect feature and the top surface of the interconnect feature is substantially at a right angle.

18. The integrated circuit of claim 12, wherein:

the plurality of conductive first interconnect features comprise a first interconnect feature, and the plurality of conductive second interconnect features comprise a second interconnect feature, wherein the first and second interconnect features are adjacent interconnect features, without any intervening interconnect feature laterally between the first and second interconnect features;

each of the first interconnect feature and the second interconnect feature has a first sidewall, a second sidewall, and a top surface, such that the second sidewall of the first interconnect feature faces the first sidewall of the second interconnect feature;

a corner between the second sidewall of the first interconnect feature and the top surface of the first interconnect feature is substantially at a right angle;

a corner between the first sidewall of the first interconnect feature and the top surface of the first interconnect feature is substantially curved;

a corner between the first sidewall of the second interconnect feature and the top surface of the second interconnect feature is substantially at a right angle; and a corner between the second sidewall of the second interconnect feature and the top surface of the second interconnect feature is substantially curved.

19. The integrated circuit of claim 18, wherein:

the plurality of conductive first interconnect features further comprise a third interconnect feature, wherein the second and third interconnect features are adjacent interconnect features, without any intervening interconnect feature laterally between the second and third interconnect features, and wherein the second interconnect feature is laterally between the first and third interconnect features;

the third interconnect feature has a first sidewall, a second sidewall, and a top surface, such that the second sidewall of the second interconnect feature faces the first sidewall of the third interconnect feature;

a corner between the second sidewall of the third interconnect feature and the top surface of the third interconnect feature is substantially at a right angle; and a corner between the first sidewall of the third interconnect feature and the top surface of the third interconnect feature is substantially curved.

20. An integrated circuit comprising:

a first interconnect layer;

a plurality of conductive interconnect features laterally separated by corresponding bodies of non-conductive material having a first dielectric material, wherein the plurality of conductive interconnect features are above the first interconnect layer;

one or more first non-conductive features having a second dielectric material with a different material composition compared to the first dielectric material, the one or more first non-conductive features being above and directly on corresponding one or more first conductive interconnect features of the plurality of conductive interconnect features;

one or more second non-conductive features having a third dielectric material with a different material composition compared to the first and second dielectric materials, the one or more second non-conductive features being above and directly on corresponding one or more second conductive interconnect features of the plurality of conductive interconnect features; and one or more third conductive interconnect features above and on corresponding one or more fourth conductive interconnect features of the plurality of conductive interconnect features.

21. The integrated circuit of claim 20, further comprising a second interconnect layer above the one or more first non-conductive features, one or more second non-conductive features, and one or more third conductive interconnect features, wherein the one or more third conductive interconnect features and the one or more fourth conductive interconnect features conductively couple the first and second interconnect layers.

22. The integrated circuit of claim 20, wherein conductive material of the one or more third conductive interconnect features and conductive material of the one or more fourth conductive interconnect features have a seam formed therebetween.

23. The integrated circuit of claim 20, wherein at least one of the one or more first conductive interconnect features has a first sidewall opposite a second sidewall, and wherein the integrated circuit further comprises:

a conformal layer between the first sidewall of the at least one of the one or more first conductive interconnect features and the corresponding body of non-conductive material, wherein the conformal layer is on the first sidewall of the at least one of the one or more first conductive interconnect features and not on the second sidewall of the at least one of the one or more first conductive interconnect features.

* * * * *